United States Patent
Mori et al.

(10) Patent No.: US 7,672,181 B2
(45) Date of Patent: Mar. 2, 2010

(54) SEMICONDUCTOR MEMORY, TEST METHOD OF SEMICONDUCTOR MEMORY AND SYSTEM

(75) Inventors: Kaoru Mori, Kawasaki (JP); Kota Hara, Kawasaki (JP); Jun Ohno, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 59 days.

(21) Appl. No.: 12/130,578

(22) Filed: May 30, 2008

(65) Prior Publication Data
US 2009/0040851 A1    Feb. 12, 2009

(30) Foreign Application Priority Data
Aug. 10, 2007   (JP)   ............... 2007-210091

(51) Int. Cl.
*G11C 7/00* (2006.01)
(52) U.S. Cl. ............... 365/201; 365/203; 365/230.06; 365/222
(58) Field of Classification Search ........ 365/201.203, 365/230.06, 222
See application file for complete search history.

(56) References Cited

U.S. PATENT DOCUMENTS 6,842,391 B2 *  1/2005  Fujioka et al. ............... 365/219
7,114,025 B2 *  9/2006  Kanda et al. ............... 711/106
7,254,090 B2 *  8/2007  Hara et al. ............... 365/239
2005/0152207 A1  7/2005  Ikeda et al.
2009/0040849 A1 *  2/2009  Mori et al. ............... 365/201
2009/0040850 A1 *  2/2009  Mori et al. ............... 365/201

FOREIGN PATENT DOCUMENTS

JP    2000-156096 A    6/2000
JP    2003-109398 A    4/2003

* cited by examiner

*Primary Examiner*—Connie C Yoha
(74) *Attorney, Agent, or Firm*—Arent Fox LLP

(57) ABSTRACT

Each sub word line is coupled to a gate of a transfer transistor of a memory cell. A first switch of a sub word decoder couples the sub word line to a high level voltage line when a main word line is in an activation level. A second switch couples the sub word line to a low level voltage line when the main word line is in an inactivation level. A third switch couples the sub word line to the low level voltage line when a word reset signal line is in an activation level. A reset control circuit disables the inactivation of the main word line or the activation of the word reset signal line during a test mode. One of the second and third switches is forcibly turned off, and thereby, an operation failure of a sub word decoder can be detected easily.

13 Claims, 24 Drawing Sheets

SEMICONDUCTOR MEMORY, TEST METHOD OF SEMICONDUCTOR MEMORY AND SYSTEM

CROSS-REFERENCE TO RELATED APPLICATION

This application is based upon and claims the benefit of priority from Japanese Patent Application No. 2007-210091, filed on Aug. 10, 2007, the entire contents of which are incorporated herein by reference.

BACKGROUND

1. Field

The present embodiments relate to a semiconductor memory having a main word decoder and sub word decoders to select word lines.

2. Description of the Related Art

In a semiconductor memory such as a DRAM, a word line is formed with a main word line and sub word lines directly coupled to a memory cell MC so as to reduce a resistance of the word line coupled to the memory cell MC and to improve an access speed. The main word line is wired to plural sub word lines in common, and it is selected by a main word decoder in accordance with an address signal. Any of the sub word lines corresponding to the selected main word line is selected by a sub word decoder in accordance with the address signal (for example, Japanese Laid-open Patent Publication No. 2003-109398).

For example, the sub word decoder has a CMOS inverter and a reset transistor (an nMOS transistor) coupled to an output of the CMOS inverter (sub word line). The CMOS inverter receives a control signal changing to high level/low level at a source of a pMOS transistor, couples an input terminal to the main word line, and couples a source of the nMOS transistor to a low-level power supply line. In the reset transistor, a drain is coupled to the sub word line, the source is coupled to the low-level power supply line, and a gate receives a signal in which the control signal is inverted.

The sub word line changes to high level when the control signal is high level and the main word line is low level, and the memory cell is accessed. Besides, when the control signal is low level or the main word line is high level, the sub word line changes to low level.

In the sub word decoder, when an on-resistance of the nMOS transistor of the CMOS inverter or of the reset transistor is high, the sub word line is reset to low level by only one of the low level of the control signal or the high level of the main word line. The above-stated on-resistance becomes high, for example, when a value of a source-resistance of the transistor is high or when a resistance of a contact coupling the source of the transistor to the low-level power supply line is high. When the resistance is not normal, there is a possibility in which the resistance increases gradually by continuously using the semiconductor memory. In this case, an operation failure (reliability failure) of the sub word decoder may occur.

However, it is difficult to detect an abnormal state of one of the resistances because the nMOS transistor of the CMOS inverter and the reset transistor may turn on at approximately the same timing.

SUMMARY

Each sub word line of a semiconductor memory is coupled to a gate of a transfer transistor of a memory cell. For example, the semiconductor memory includes a system together with a controller giving access to the semiconductor memory. Bit lines are coupled to a storage part of the memory cell via the transfer transistor. Each sub word decoder is provided with corresponding to the sub word line, and has a first, second and third switches. The first switch turns on when the main word line is in an activation level so as to couple the sub word line to a high-level voltage line. The second switch turns on when the main word line is in an inactivation level so as to couple the sub word line to a low-level voltage line. The third switch turns on when a word reset signal line is in an activation level so as to couple the sub word line to the low-level voltage line. A reset control circuit disables either of the inactivation of the main word line or the activation of the word reset signal line to disable that either of the second switch or the third switch turns on during a test mode. Namely, the sub word line changes to a low-level voltage by using only one of the second switch or the third switch during the test mode.

DETAILED DESCRIPTION OF THE EMBODIMENTS

Figure 1:
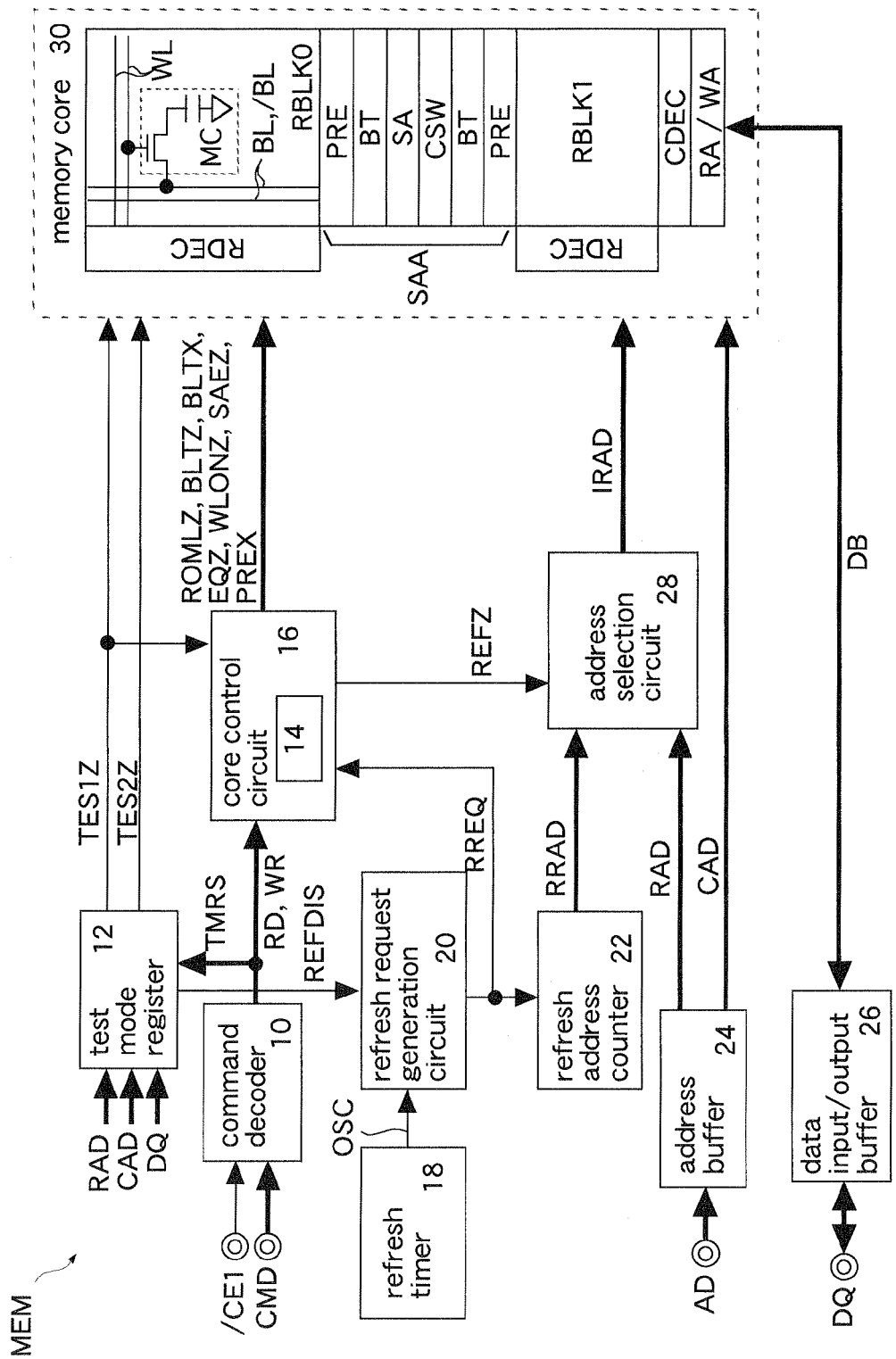
FIG. 1 illustrates a first embodiment of the present invention.

Hereinafter, embodiments will be described, using the drawings. In the drawings, each signal line shown by the heavy line has a plurality of lines. Part of blocks to which the heavy lines are connected has a plurality of circuits. Each signal line through which the signal is transmitted is denoted by the same reference symbol as the signal name. Each signal starting with "/" and each signal ending with "X" represents negative logic. Each signal ending with "Z" represents positive logic. Each double circle in the drawings represents an external terminal.

FIG. 1 illustrates a first embodiment. The semiconductor memory MEM is an FCRAM (Fast Cycle RAM) of pseudo SRAM type for example. This FCRAM has DRAM memory cells and an interface of SRAM. The memory MEM has a command decoder 10, a test mode register 12, a core control circuit 22 having an arbiter 14, a refresh timer 18, a refresh request generation circuit 20, a refresh address counter 22, an address buffer 24, a data input/output buffer 26, an address selection circuit 28 and a memory core 30.

Figure 17:
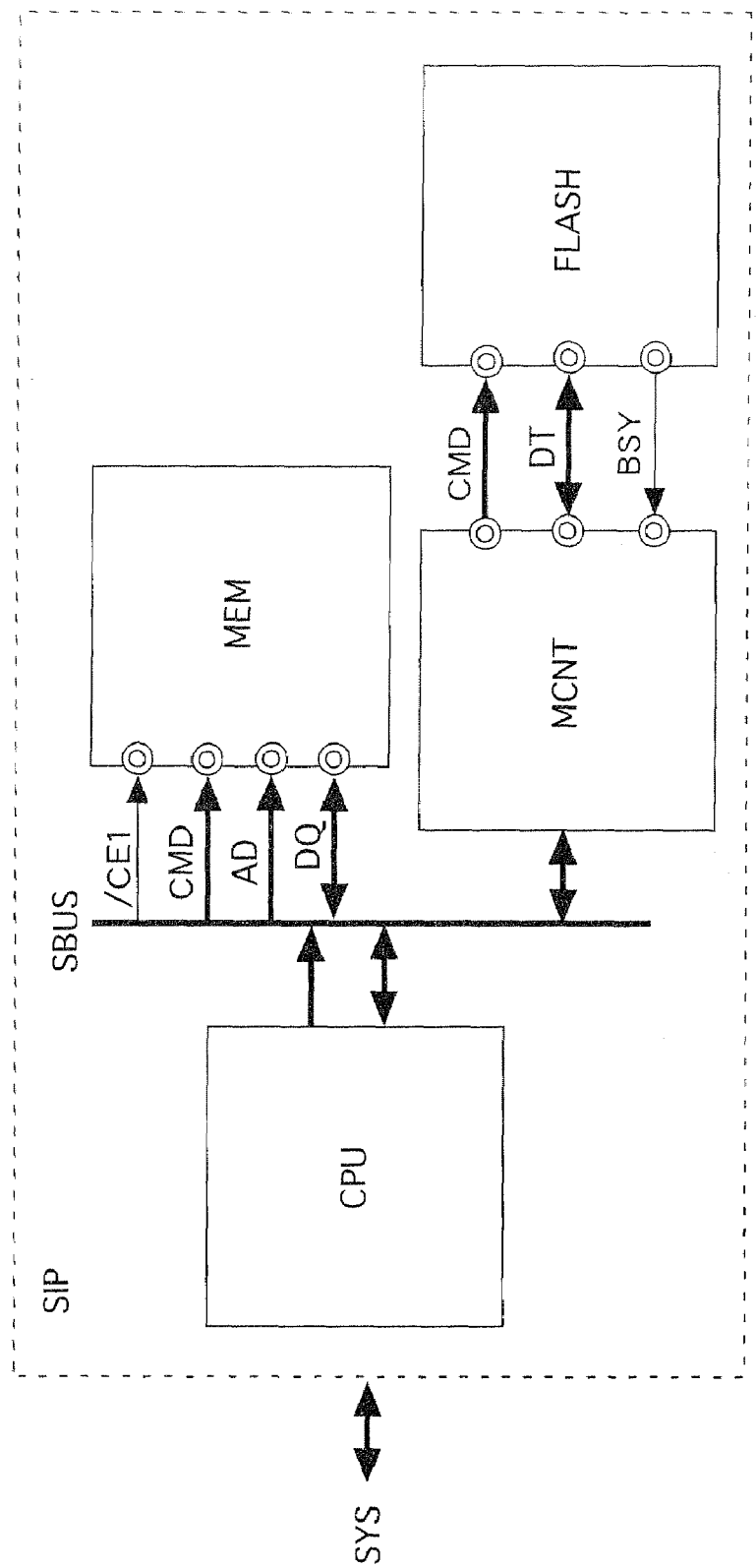
FIG. 17 illustrates a system of the first embodiment.

Although not illustrated in particular, the memory MEM has a redundancy circuit for relieving a defective memory cell or the like, a redundancy fuse circuit for making the redundancy circuit become usable, and a redundancy control circuit. For example, the redundancy circuit has redundancy memory cells, a redundancy sub word line coupled to the redundancy memory cells, a redundancy main word line, a redundancy sub word decoder coupled to the redundancy sub word line and the redundancy main word line, a redundancy sub word driver coupled to the redundancy sub word decoder, and a redundancy main word decoder coupled to the redundancy main word line and the like. The redundancy fuse circuit stores a failure address. The redundancy control circuit detects a match of an address signal and the failure address, disables access to normal memory cells and enables access to the redundancy memory cells. Note that the memory MEM forms a system together with a CPU, as illustrated in FIG. 17, which will be described later.

The command decoder 10 outputs a command recognized in accordance with a logical level of a chip enable signal /CE1 and a command signal CMD as a read command RD, a write command WR to execute an access operation of the memory core 30, as a test mode register set command TMRS to set the test mode register 12, or the like. The read command RD and the write command WR are external access requests to execute the access operation to the memory core 30. For example, the command signals CMD are a write enable signal /WE and an output enable signal /OE.

The test mode register 12 has plural registers which are set by receiving a row address signal RAD, a column address signal CAD, and a data signal DQ synchronously with the test mode register set command TMRS. For example, the test mode register 12 outputs test signals TES1Z, TES2Z respectively in accordance with a value of predetermined test bits (two bits) of the row address signal RAD. Either of the test signals TES1Z, TES2Z is activated by the set of the test bits, and thereby, the memory MEM transfers from a normal operation mode to a first test mode or a second test mode. The test signal TES1Z is activated during the first test mode, and the test signal TES2Z is activated during the second test mode. Here, the normal operation mode is an operation mode in which a system (user) mounting the memory MEM gives access to the memory MEM, and it is the operation mode when the memory MEM is powered on. Besides, the test mode register 12 outputs a refresh disable signal REFDIS when a refresh disable bit is set. Incidentally, a signal supplied to the test mode register 12 may be at least any one of the row address signal RAD, the column address signal CAD, and the data signal DQ.

The core control circuit 16 changes a refresh signal REFZ to high logical level when a refresh operation is executed, and changes the refresh signal REFZ to low logical level when the refresh operation is not executed. The arbiter 14 determines an order of precedence between the read command RD and the write command WR, and a refresh request RREQ. For example, the core control circuit 16 gives preference to the refresh request RREQ when the refresh request RREQ received a little earlier than a read command. The read operation responding to the read command RD is suspended until the refresh operation responding to the refresh request RREQ completes. Conversely, when the refresh request RREQ is supplied during the read operation, the refresh operation responding to the refresh request RREQ is temporary suspended. The core control circuit 16 outputs control signals ROMLZ, BLTZ, BLTX, EQZ, WLONZ, SAEZ, PREX, and so on controlling the access operations (the read operation, write operation, or refresh operation) of the memory core 30 responding to the read command RD, the write command WR, or the refresh request RREQ. The control signal ROMLZ is a basic timing signal showing a start of the access operations. The control signals BLTZ, BLTX, EQZ are timing signals to precharge bit lines BL, /BL. The control signal WLONZ is a timing signal to activate a word line WL. A control signal SAE is a timing signal to activate a sense amplifier SA. Besides, the core control circuit 16 outputs control signals controlling operations of the address buffer 24 and the data input/output buffer 26 in accordance with an operation mode (for example, a burst length) set in the mode register which is not illustrated and set by mode register set command MRS.

The refresh timer 18 has an oscillator outputting an oscillating signal OSC with a predetermined cycle. The refresh request generation circuit 20 divides a frequency of the oscillating signal OSC, and generates a refresh request (an internal access request). The refresh request generation circuit 20 stops the generation of the refresh request RREQ when the refresh disable signal REFDIS from the test mode register 12 is received. The refresh operation is thereby disabled. Namely, the refresh request generation circuit 20 operates also as a refresh disable circuit disabling the refresh operation. Incidentally, the refresh disable signal REFDIS output from the test mode register 12 responding to a set of a bit SSTP may be supplied to the refresh timer 18 to stop the refresh timer 18 so as to stop a self refresh operation. The refresh disable signal REFDIS may be supplied to the core control circuit 16 to disable an acceptance of a refresh request signal RREQ by the core control circuit 16. The refresh address counter 22 sequentially generates a refresh address signal RRAD synchronously with the refresh request RREQ. The refresh address signal RRAD is a row address signal to select a later-described word line WL.

The address buffer 24 simultaneously receives the row address signal RAD and the column address signal CAD supplied to an address terminal AD, and outputs the received addresses. Namely, this memory MEM adopts an address non-multiplex method. The column address signal CAD is supplied to select the later-described pair of bit lines BL, /BL. The data input/output buffer 26 receives a write data signal via the data terminal DQ (for example, 16 bits), and outputs the received data signal to a data bus DB. Besides, the data input/output buffer 26 receives a read data signal from the later-described memory cell MC via the data bus DB, and outputs the received data signal to the data terminal DQ.

The address selection circuit 28 selects the refresh address signal RRAD (REFZ=high level) when the refresh operation is executed, selects the row address signal RAD (REFZ=low level) when the refresh operation is not executed, and outputs the selected signal to the memory core 30 as an internal row address signal IRAD.

The memory core 30 has row blocks RBLK (RBLK0-1; memory block), row decoders RDEC (RDEC0-1) corresponding to the row blocks RBLK0-1, a sense amplifier area SAA disposed between the row blocks RBLK0-1, a column decoder CDEC, a read amplifier RA, and a write amplifier WA. Incidentally, the number of the row blocks RBLK may be four, eight, ten or the like. The sense amplifier area SAA has precharge circuits PRE and coupling switches BT respectively corresponding to the row blocks RBLK0-1, and a sense amplifier SA and a column switch CSW commonly used by the row blocks RBLK0-1.

The column address decoder CDEC decodes the column address signal CAD to select the number of the pair of bit lines BL, /BL corresponding to the number of bits of the data terminal DQ. The read amplifier RA amplifies complementary read data output via the column switch CSW upon the read access operation. The write amplifier WA amplifies complementary write data supplied via the data bus DB upon the write access operation, and supplies to the pair of bit lines BL, /BL.

Figure 2:
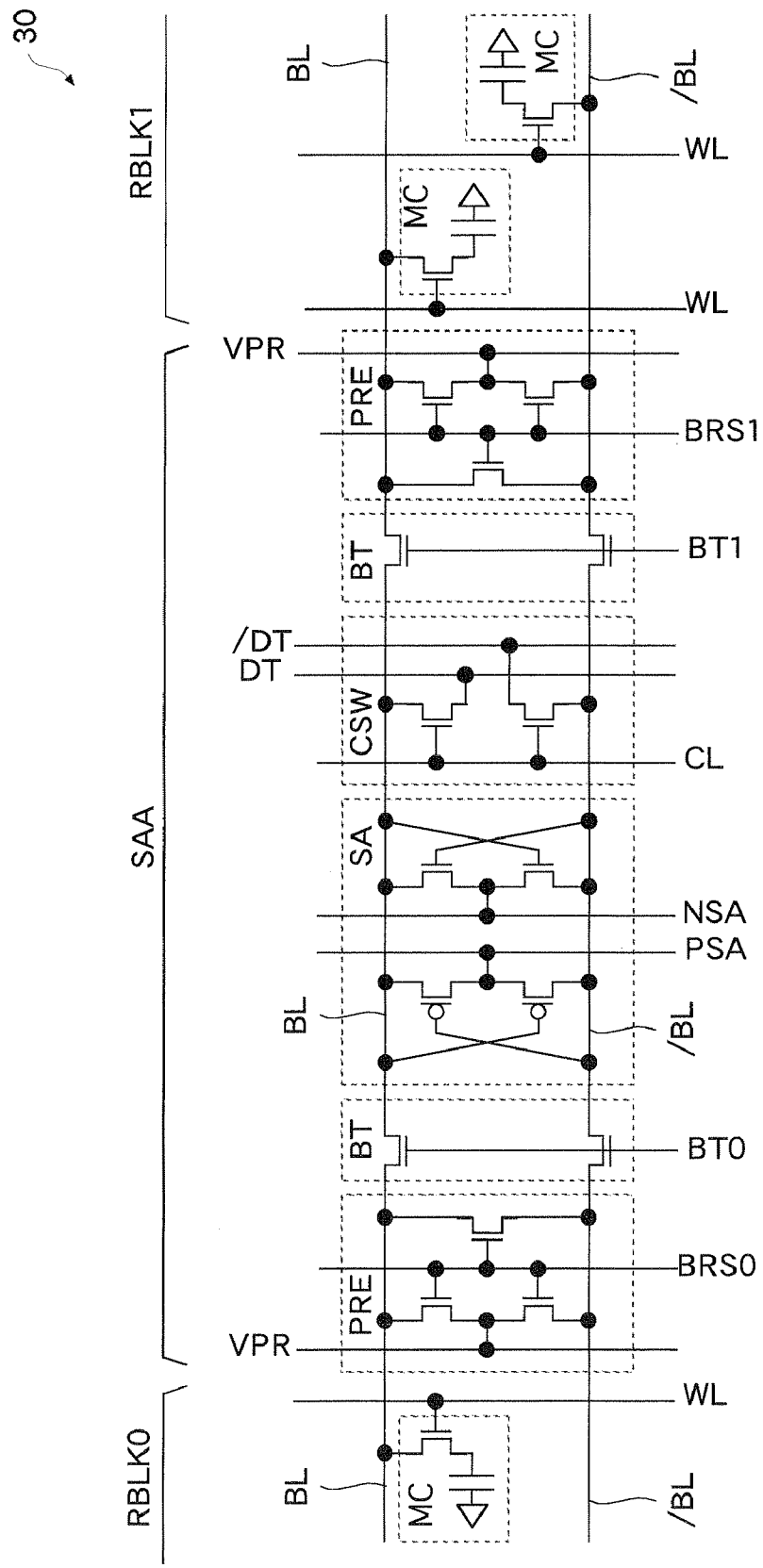
FIG. 2 illustrates details of a substantial part of a memory core shown in FIG. 1.

FIG. 2 illustrates details of a substantial part of the memory core 30 illustrated in FIG. 1. Note that for convenience, in FIG. 2, data lines coupled to the bit lines BL, /BL via a coupling switch BT are also referred to as bit lines BL, /BL.

Each of the row blocks RBLK0-1 has a plurality of memory cells MC arranged in a matrix form, word lines WL each coupled to memory cells MC arranged in the vertical direction of the diagram, and bit lines BL, /BL coupled to memory cells MC arranged in the horizontal direction of the diagram. Each memory cell MC has a capacitor (storage part) for retaining data as a charge, and a transfer transistor for coupling one end of this capacitor to the bit line BL (or /BL). The other end of the capacitor is coupled to a cell-plate voltage line VCP (not shown). A gate of the transfer transistor is coupled to a word line WL. By selecting the word line WL (activation to a high level), one of read operation, write operation, and refresh operation is performed. The memory cells MC coupled to the word line WL is coupled to one of the bit lines BL, /BL. Accordingly, when accessing a memory cell MC coupled to the bit line BL for example, the bit line /BL functions as a reference voltage line (precharge voltage VPR).

Each coupling switch BT is formed by an nMOS transistor (switch). One of source/drain of the nMOS transistor is coupled to the bit line BL (or /BL), and the other of the source/drain of the nMOS transistor is coupled to the sense amplifier SA. A gate of the nMOS transistor receives a switch control signal BT (BT0, BT1). The coupling switch BT couples the bit lines BL, /BL of the row block RBLK to the sense amplifier SA while receiving the switch control signal BT at a high level. In this embodiment, a pair of coupling switches BT coupled to the bit lines BL, /BL operate independently from each other.

Each precharge circuit PRE is formed by a pair of nMOS transistors for coupling a complementary bit lines BL, /BL to the precharge voltage line VPR and an nMOS transistor for coupling the bit lines BL, /BL with each other. A gate of the nMOS transistor of the precharge circuit PRE receives a precharge control signal BRS (BRS0, BRS1). The precharge circuit PRE supplies the precharge voltage VPR to the bit lines BL, /BL and also equalizes voltages of the bit lines BL, /BL while receiving the precharge control signal BRS at a high level indicating that the memory cells MC are not accessed.

The sense amplifier SA is formed by a pair of CMOS inverters having inputs and outputs coupled to each other. The inputs of each CMOS inverter (gates of the transistors) are coupled to the bit line BL (or /BL). Each CMOS inverter is formed by an nMOS transistor and a pMOS transistor arranged in the horizontal direction of the diagram. A source of the pMOS transistor of each CMOS inverter receives a sense amplifier activation signal PSA. A source of the nMOS transistor of each CMOS inverter receives a sense amplifier activation signal NSA. The sense amplifier activation signal PSA is set to a high level (internal power supply voltage VII; 1.6V for example) when the sense amplifier SA operates, and set to the precharge voltage VPR when the sense amplifier SA does not operate. The sense amplifier activation signal NSA is set to a low level (ground voltage VSS for example) when the sense amplifier SA operates, and set to the precharge voltage VPR when the sense amplifier SA does not operate.

The column switch CSW is formed by an nMOS transistor coupling the bit line BL to a data line DT and an nMOS transistor coupling the bit line /BL to a data line /DT. A gate of each nMOS transistor receives a column switch signal CL. Upon a read operation, read data signals on the bit lines BL, /BL amplified by the sense amplifier SA are transmitted to the data lines DT, /DT via the column switch CSW. Upon a write operation, write data signals supplied via the data lines DT, /DT are written to the memory cells MC via the bit lines BL, /BL.

Figure 3:
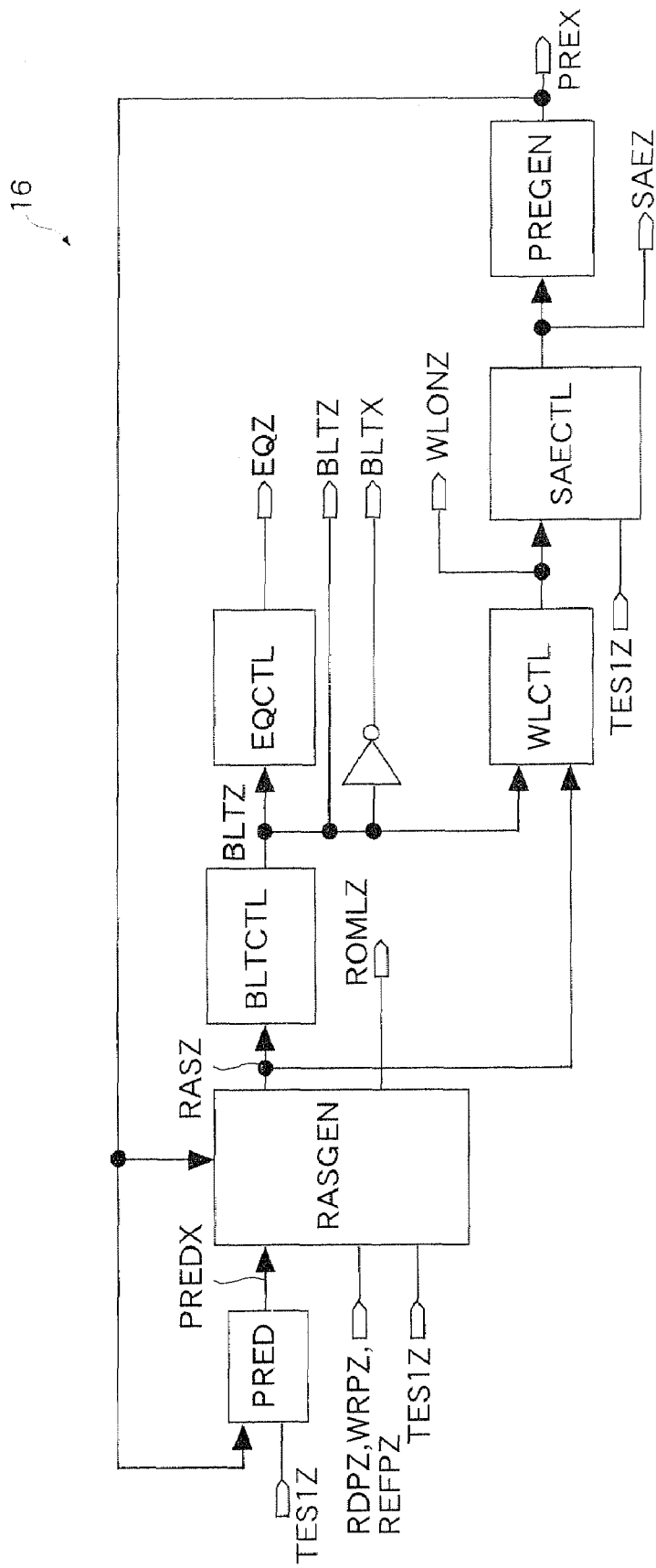
FIG. 3 illustrates details of a core control circuit shown in FIG. 1.

FIG. 3 illustrates details of the core control circuit 16 shown in FIG. 1. The core control circuit 16 has a precharge delay circuit PRED, the RAS generator RASGEN, a bit control circuit BLTCTL, an equalization control circuit EQCTL, a word control circuit WLCTL, a sense amplifier control circuit SAECTL, and a precharge generation circuit PREGEN.

The precharge delay circuit PRED operates during the first test mode, and generates a delayed precharge control signal PREDX in which the precharge control signal PREX is delayed. The RAS generator RASGEN generates the basic timing signals RASZ, ROMLZ by using a read pulse signal RDPZ, a write pulse signal WRPZ or a refresh pulse signal REFPZ, and the precharge signal PREX (or the delayed precharge control signal PREDX). The signals RDPZ, WRPZ and REFPZ are respectively generated with corresponding to the read command RD, the write command WR and the refresh request RREQ. The core control circuit 16 outputs the read pulse signal RDPZ when the read operation is executed, outputs the write pulse signal WRPZ when the write operation is executed, and outputs the refresh pulse signal REFPZ when the refresh operation is executed in accordance with the operations determined by the arbiter 14.

During the first test mode, the RAS generator RASGEN delays an inactivation timing (falling edge) of the basic timing signals RASZ, ROMLZ compared to the normal operation mode. Bit control signals BLTZ, BLTX output from the bit control circuit BLTCTL, an equalize control signal EQZ output from the equalization control circuit EQCTL, a word control signal WLONZ output from the word control circuit WLCTL, and a sense amplifier control signal SAEZ output from the sense amplifier control circuit SAECTL are delayed sequentially resulting from the delay of the basic timing signal RASZ. The equalize control signal EQZ is a timing signal to generate a bit line control signal BRS.

Figure 20:
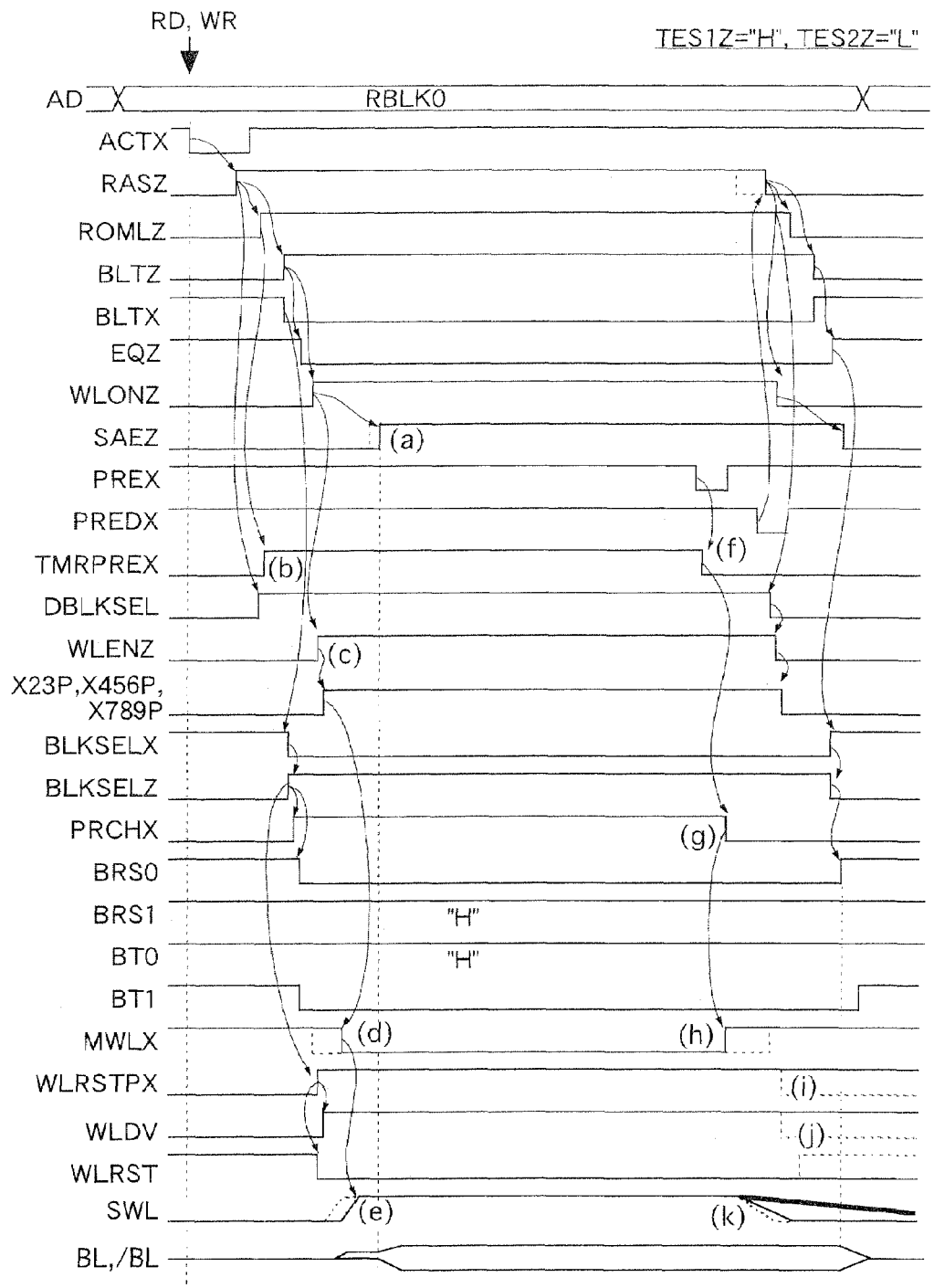
FIG. 20 illustrates an access operation in a first test mode.
Figure 21:
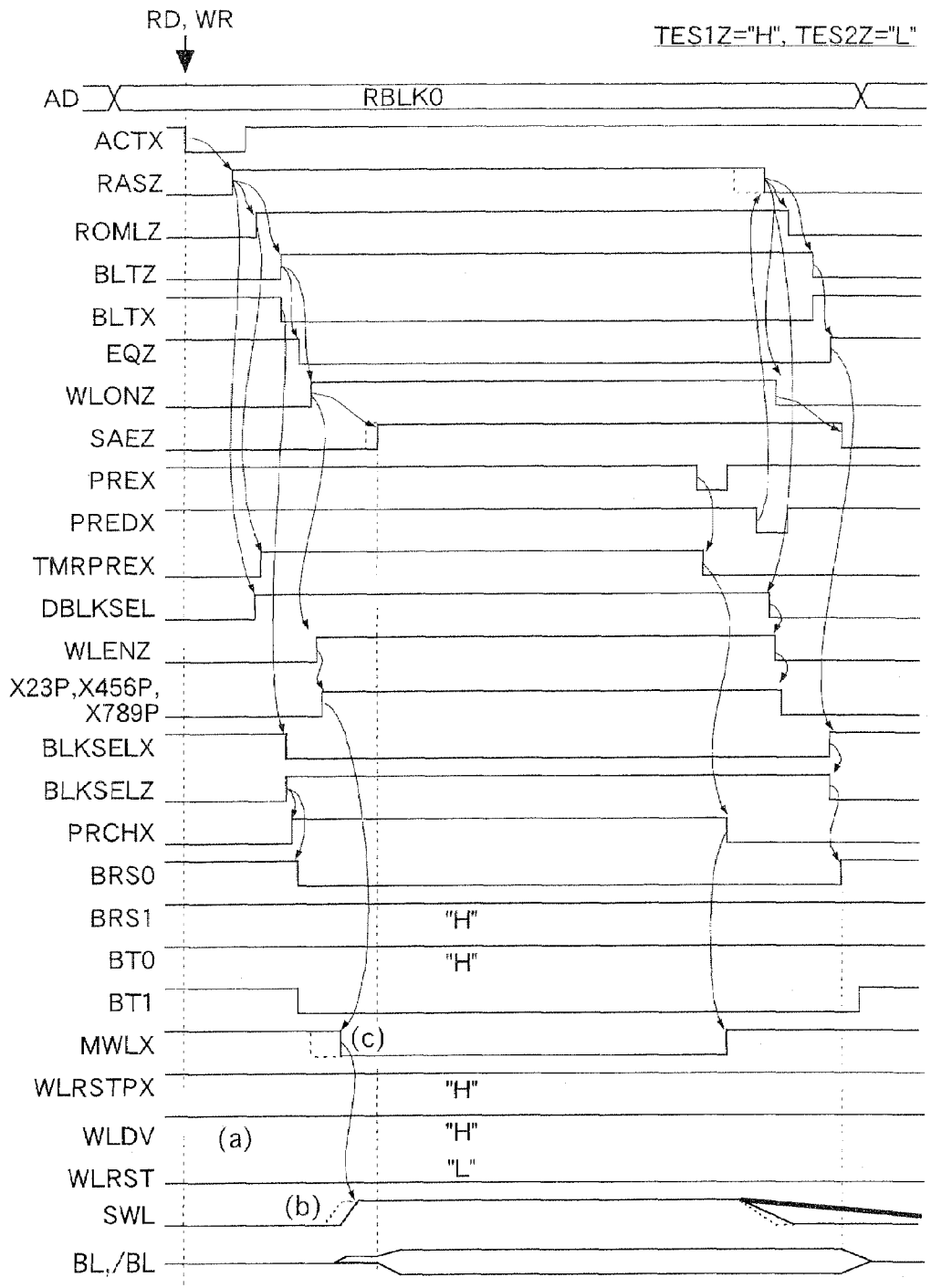
FIG. 21 illustrates another access operation in the first test mode.

The RAS generator RASGEN, the bit control circuit BLTCTL, and the equalization control circuit EQCTL operate also as timing control circuits delaying an activation timing of the precharge control signal BRS during the first test mode compared to the normal operation mode so as to elongate a time from an inactivation of the main word line MWLX to an activation of the bit line control signal BRS to high level starting the precharge of the bit lines BL, /BL, as shown in FIG. 20 and FIG. 21.

The bit control circuit BLTCTL generates the bit control signals BLTZ, BLTX in accordance with the basic timing signal RASZ. The equalization control circuit EQCTL generates the equalize control signal EQZ in accordance with the bit control signal BLTZ. The word control circuit WLCTL generates the word control signal WLONZ in accordance with the bit control signal BLTZ and the basic timing signal RASZ. The sense amplifier control circuit SAECTL generates the sense amplifier control signal SAEZ in accordance with the word control signal WLONZ. During the first test mode, the sense amplifier control circuit SAECTL delays an activation timing (rising edge) of the sense amplifier control signal SAEZ compared to the normal operation mode. The precharge generation circuit PREGEN generates the precharge control signal PREX in accordance with the sense amplifier control signal SAEZ.

Figure 4:
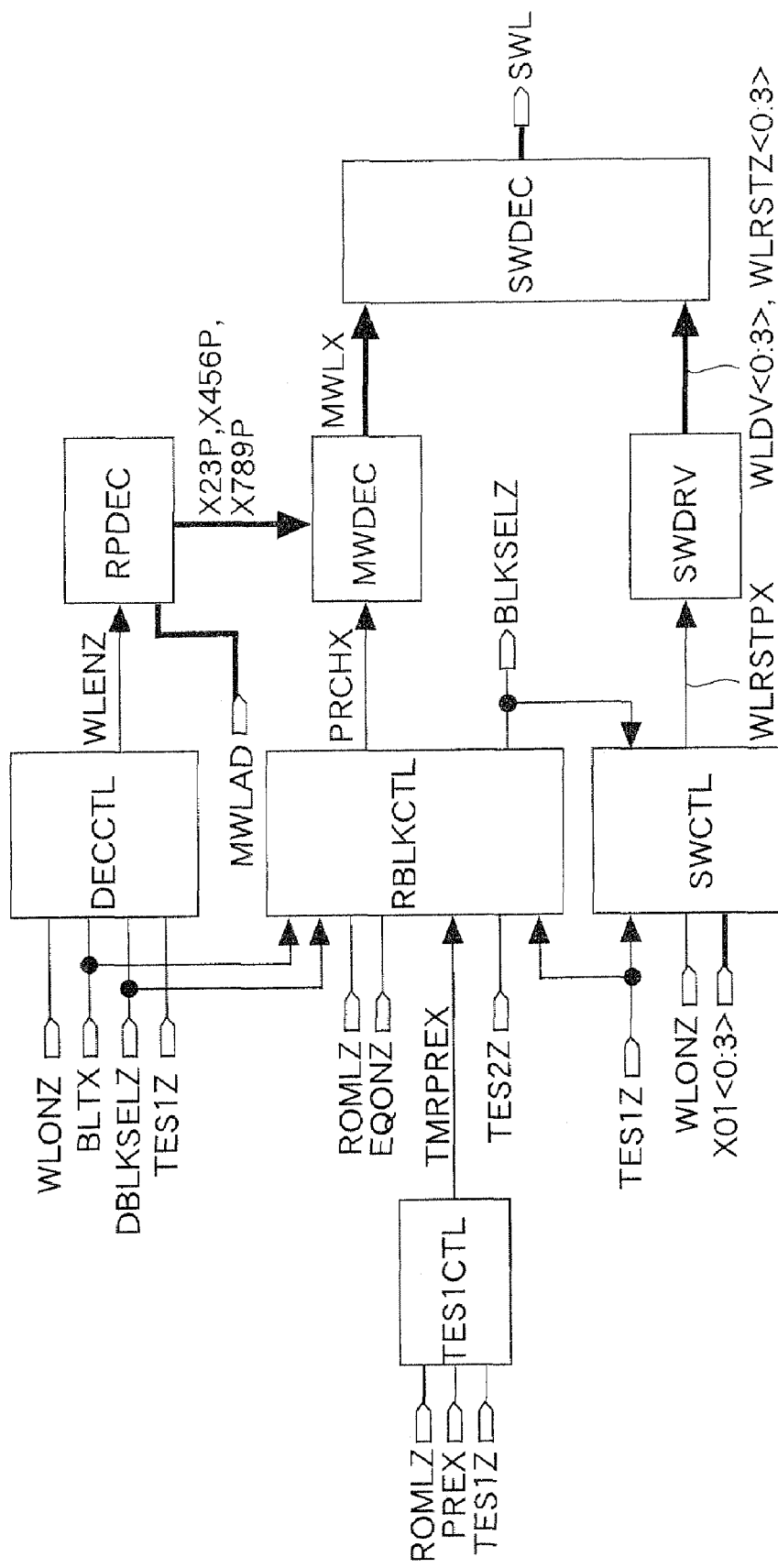
FIG. 4 illustrates details of a row decoder shown in FIG. 1.

FIG. 4 illustrates details of the row decoder RDEC shown in FIG. 1. The row decoder RDEC has a decode control circuit DECCTL, a row predecoder RPDEC, a test control circuit TES1CTL, a block control circuit RBLKCTL, a main word decoder MWDEC, a sub word control circuit SWCTL, a sub word driver SWDRV and a sub word decoder SWDEC.

The decode control circuit DECCTL generates a word enable signal WLENZ in accordance with the bit control signal BLTX and a block selection signal DBLKSELZ during the normal operation mode and the second test mode, and generates the word enable signal WLENZ in accordance with the word control signal WLONZ and the block selection signal DBLKSELZ during the first test mode.

The row predecoder RPDEC receives the word enable signal WLENZ and a main word address MWLAD, and generates decoded signals X23P, X456P and X789P. The main word address MWLAD is configured by a signal (RAD2-9) excluding the lower two bits (RAD0-1) of the row address signal RAD. The decoded signal X23P (four bits) is generated by decoding the row addresses RAD2-3. The decoded signal X456P (eight bits) is generated by decoding the row addresses RAD4-6. The decoded signal X789P (eight bits) is generated by decoding the row addresses RAD7-9.

The test control circuit TES1CTL operates during the first test mode, and generates a test precharge signal TMRPREX in accordance with the basic timing signal ROMLZ and the precharge control signal PREX. The block control circuit RBLKCTL receives the control signals BLTX, ROMLZ, EQONZ, TMRPREX, the block selection signal DBLKSELZ, and the test signals TES1Z, TES2Z, and generates a precharge signal PRCHX and a block selection signal BLKSELZ. The block selection signals DBLKSELZ (DBLKSELZ0-1) are generated synchronously with the basic timing signal RASZ to select either of the row blocks RBLK0-1. The precharge signal PRCHX is activated earlier during the first test mode compared to during the normal operation mode. Besides, the precharge signal PRCHX is kept at high level during the second test mode.

The test control circuit TES1CTL and the block control circuit RBLKCTL operate as timing control circuits making an activation timing of the precharge signal PRCHX (a timing signal) during the first test mode earlier compared to the normal operation mode, so as to elongate a time from an inactivation of the main word line MWLX to the activation of the bit line control signal BRS to high level starting the precharge of the bit lines BL, /BL, as shown in FIG. 20 and FIG. 21.

The main word decoder MWDEC generates the main word signal MWLX in accordance with the decoded signals X23P, X456P, X789P, and the precharge signal PRCHX. The sub word control circuit SWCTL receives the word control signal WLONZ, the block selection signal BLKSELZ, a decoded signal X01, and the test signal TES1Z, and generates a word reset signal WLRSTPX. The decoded signals X01<0:3> is generated by decoding the lower two bits (RAD0-1) of the row address signal RAD. The test signal TES1Z is used to disable an inactivation of the word reset signal WLRSTPX during the first test mode.

The sub word driver SWDRV generates word drive signals WLDV<0:3> and word reset signals WLRSTZ<0:3> in accordance with the word reset signal WLRSTPX. The sub word decoder SWDEC activates or inactivates a sub word line SWL (a word line) in accordance with the main word signal MWLX, the word drive signal WLDV, and the word reset signal WLRSTZ. In this embodiment, four sub word lines SWL are wired with corresponding to one main word line MWL.

Figure 5:
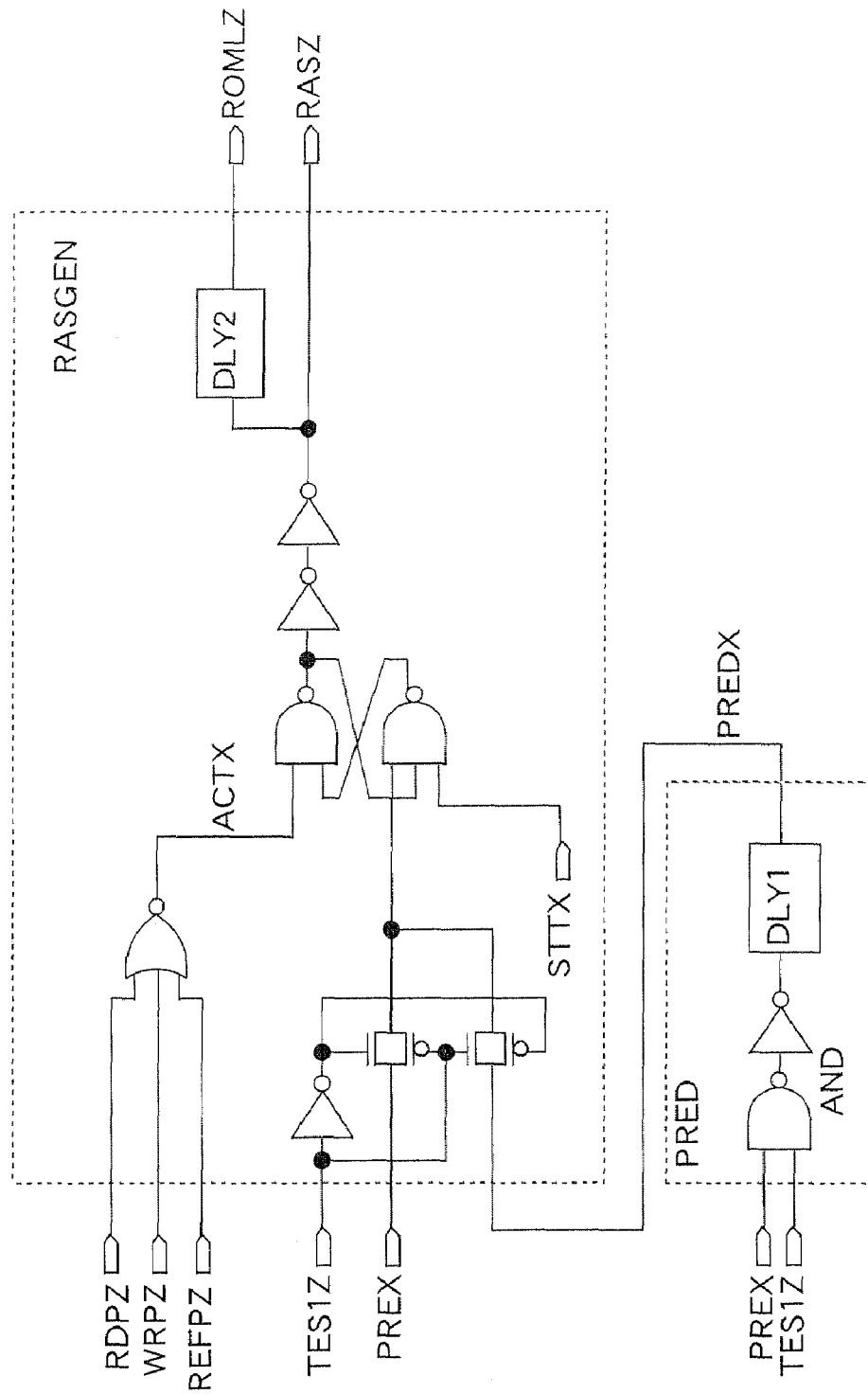
FIG. 5 illustrates details of a precharge delay circuit and an RAS generator shown in FIG. 3.

FIG. 5 illustrates details of the precharge delay circuit PRED and the RAS generator RASGEN shown in FIG. 3. The precharge delay circuit PRED has an and-circuit AND receiving the precharge signal PREX and the test signal TES1Z, and a delay circuit DLY1. The RAS generator RASGEN activates the basic timing signals RASZ, ROMLZ synchronously with an active pulse ACTPX generated by the read pulse signal RDPZ, the write pulse signal WRPZ, or the refresh pulse signal REFPZ. The RAS generator RASGEN inactivates the basic timing signals RASZ, ROMLZ synchronously with the precharge signal PREX during the normal operation mode and the second test mode. The RAS generator RASGEN inactivates the basic timing signals RASZ, ROMLZ synchronously with the delayed precharge control signal PREDX during the first test mode. The basic timing signal ROMLZ is generated by delaying the basic timing signal RASZ by a delay circuit DLY2. Incidentally, a starter signal STTX is generated by a not-shown power-on reset circuit, and it temporary changes to low level upon a power-on of the memory MEM.

Figure 6:
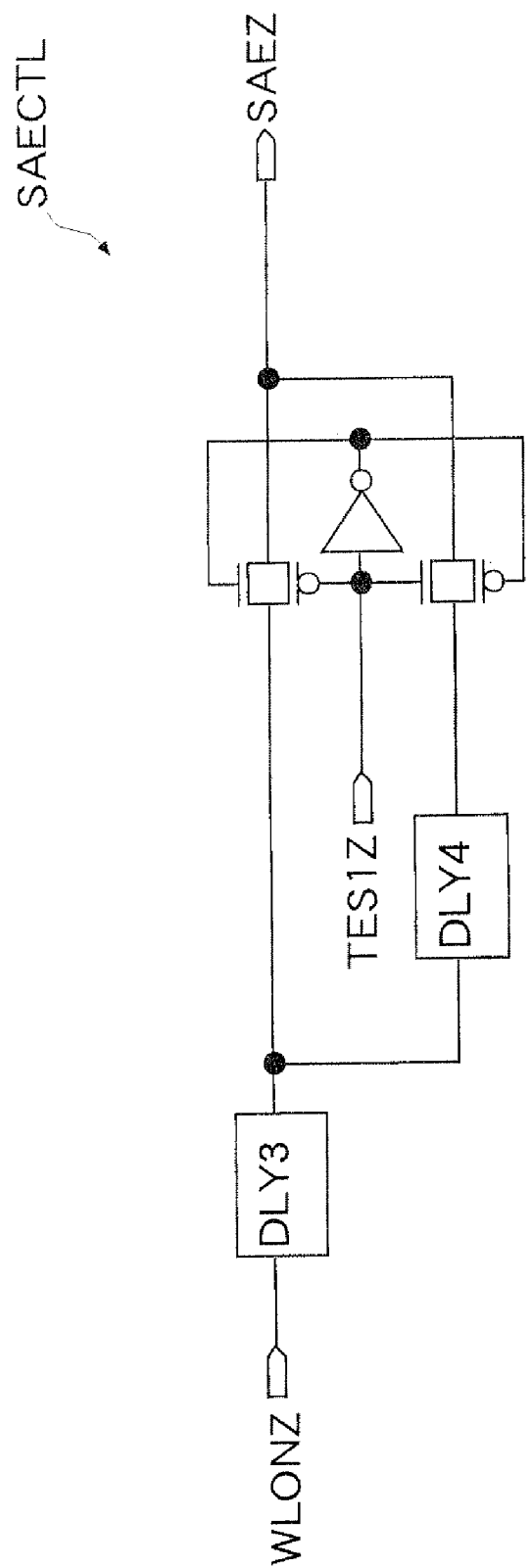
FIG. 6 illustrates details of a sense amplifier control circuit shown in FIG. 3.

FIG. 6 illustrates details of the sense amplifier control circuit SAECTL shown in FIG. 3. The sense amplifier control circuit SAECTL delays the word control signal WLONZ by a delay circuit DLY3 during the normal operation mode and the second test mode, and generates the sense amplifier control signal SAEZ. The sense amplifier control circuit SAECTL delays the word control signal WLONZ by the delay circuits DLY3, DLY4 during the first test mode, and generates the sense amplifier control signal SAEZ. As stated above, the sense amplifier control circuit SAECTL operates as a timing control circuit delaying an activation timing of the sense amplifier control signal SAEZ during the first test mode compared to the normal operation mode.

Figure 7:
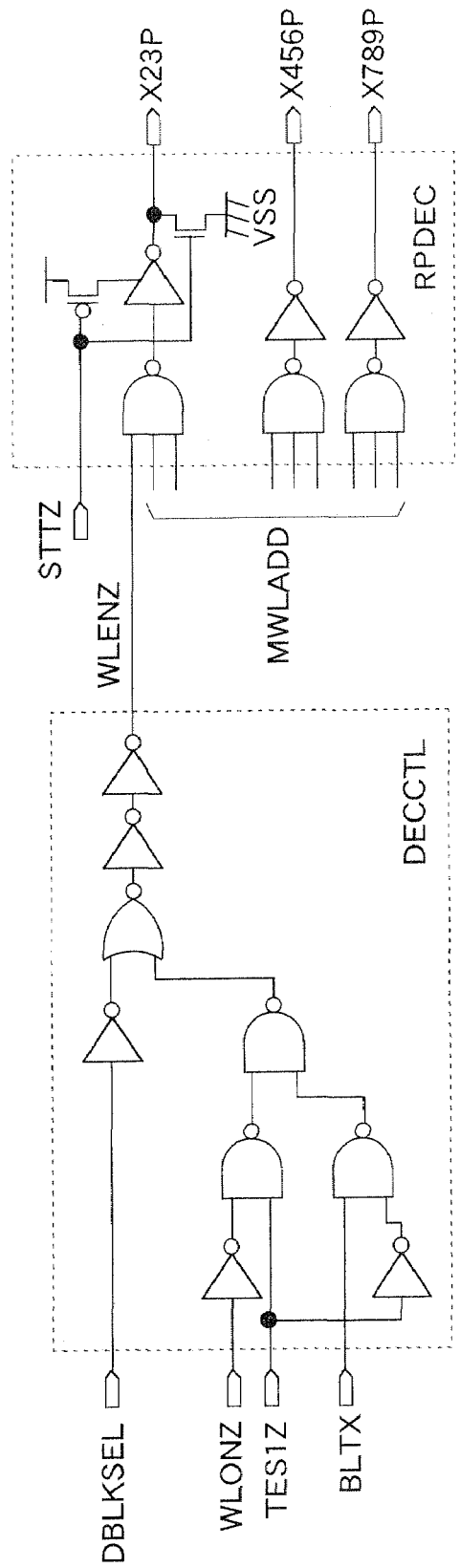
FIG. 7 illustrates details of a decode control circuit and a row predecoder shown in FIG. 4.
Figure 19:
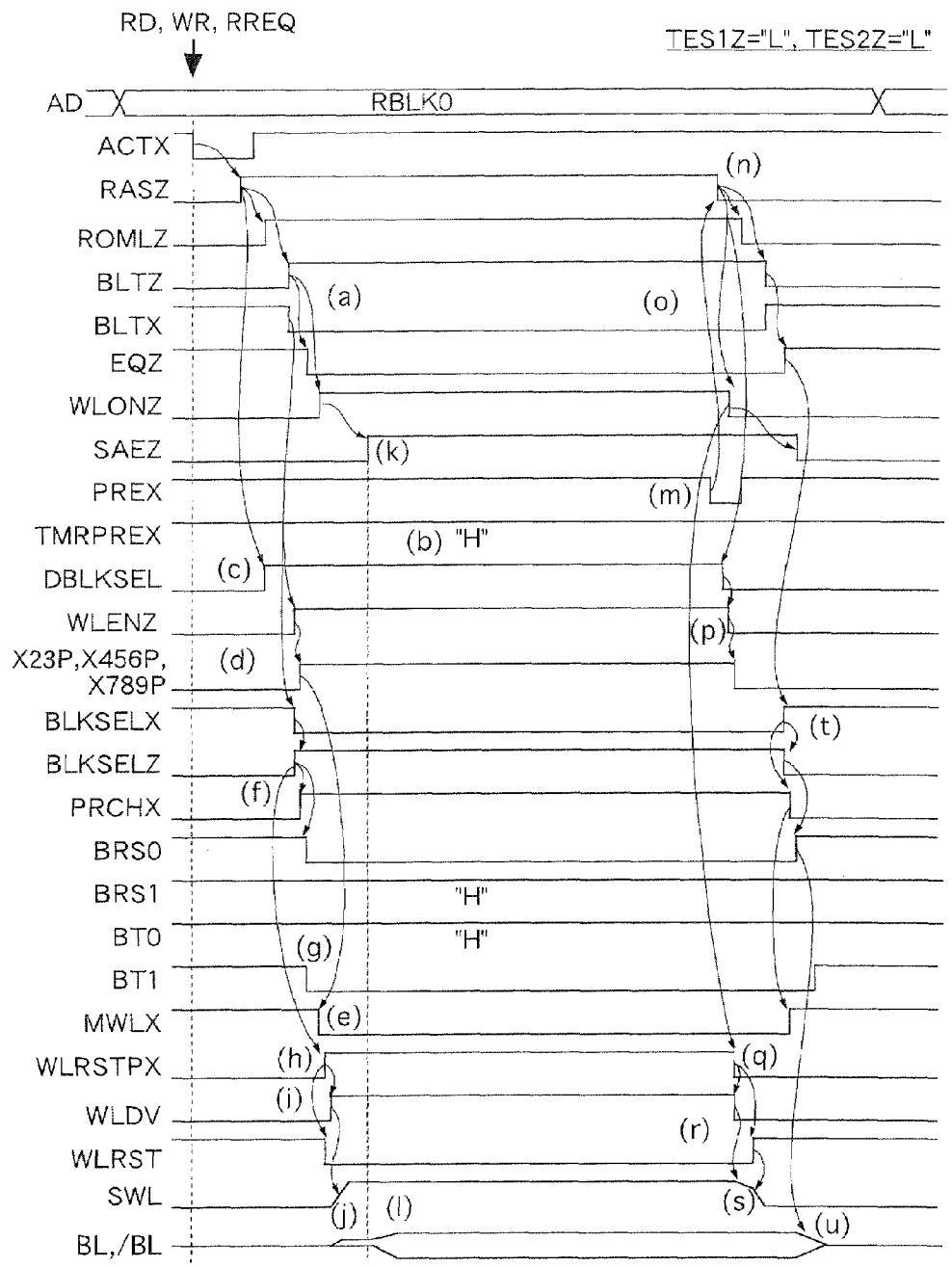
FIG. 19 illustrates an access operation in the normal operation mode.

FIG. 7 illustrates details of the decode control circuit DECCTL and the row predecoder RPDEC shown in FIG. 4. The decode control circuit DECCTL activates the word enable signal WLENZ synchronously with an activation of the bit control signal BLTX, and inactivates the word enable signal WLENZ synchronously with the block selection signal DBLKSELZ during the normal operation mode and the second test mode. The decode control circuit DECCTL activates the word enable signal WLENZ synchronously with an activation of the word control signal WLONZ, and inactivates the word enable signal WLENZ synchronously with the block selection signal DBLKSELZ during the first test mode. As shown in FIG. 19 and FIG. 20, the activation timing of the word control signal WLONZ is later than the activation timing of the bit control signal BLTX. Accordingly, the word enable signal WLENZ is activated later during the first test mode compared to during the normal operation mode. As stated above, the decode control circuit DECCTL operates as a timing control circuit delaying the activation timing of the word enable signal WLENZ (a first timing signal) during the first test mode compared to the normal operation mode, so as to elongate a time from a stop of the precharge of the bit lines BL, /BL to the activation of the main word line MWLX.

The row predecoder RPDEC receives the word enable signal WLENZ and the main word addresses MWLAD (RAD2-3), and generates the decoded signal X23p. Besides, the row predecoder RPDEC generates the decoded signals X456P, X789P in accordance with the main word addresses MWLAD (RAD4-6 and RAD7-9). Incidentally, the starter signal STTZ is generated by the not-shown power-on reset circuit, and it temporary changes to high level upon the power-on of the memory MEM.

Figure 8:
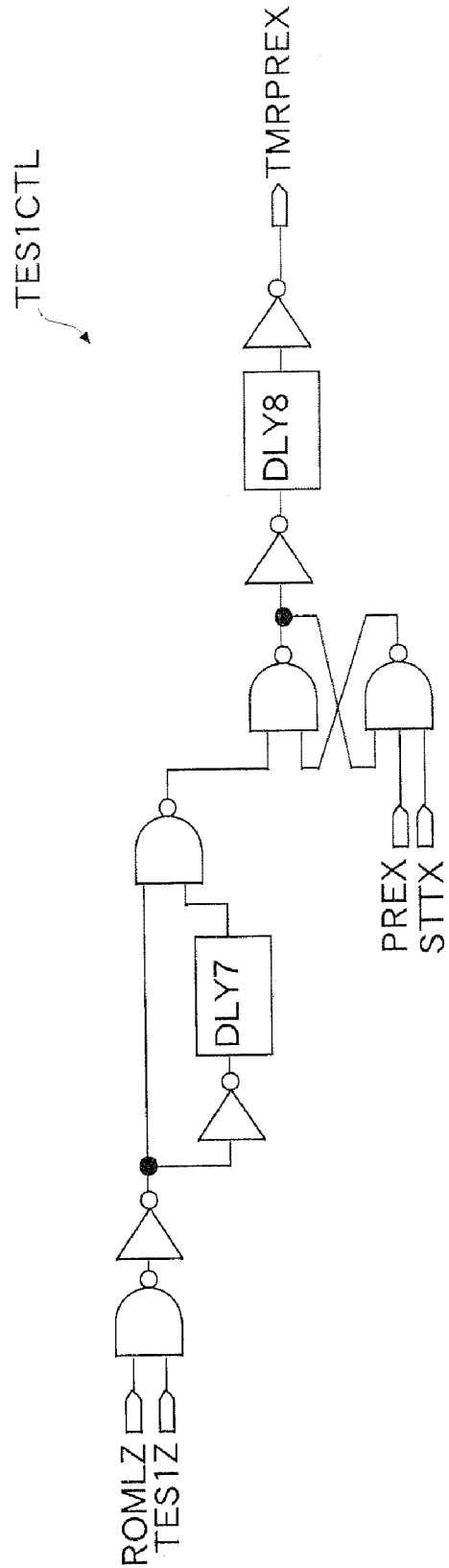
FIG. 8 illustrates details of a test control circuit shown in FIG. 4.

FIG. 8 illustrates details of the test control circuit TES1CTL shown in FIG. 4. The test control circuit TES1CTL operates only during the first test mode. The test control circuit TES1CTL inactivates the test precharge signal TMR-PREX to high level synchronously with the basic timing signal ROMLZ, and activates the test precharge signal TMR-PREX to low level synchronously with the precharge signal PREX. The test control circuit TES1CTL keeps the test precharge signal TMRPREX at high level during the normal operation mode and the second test mode.

Figure 9:
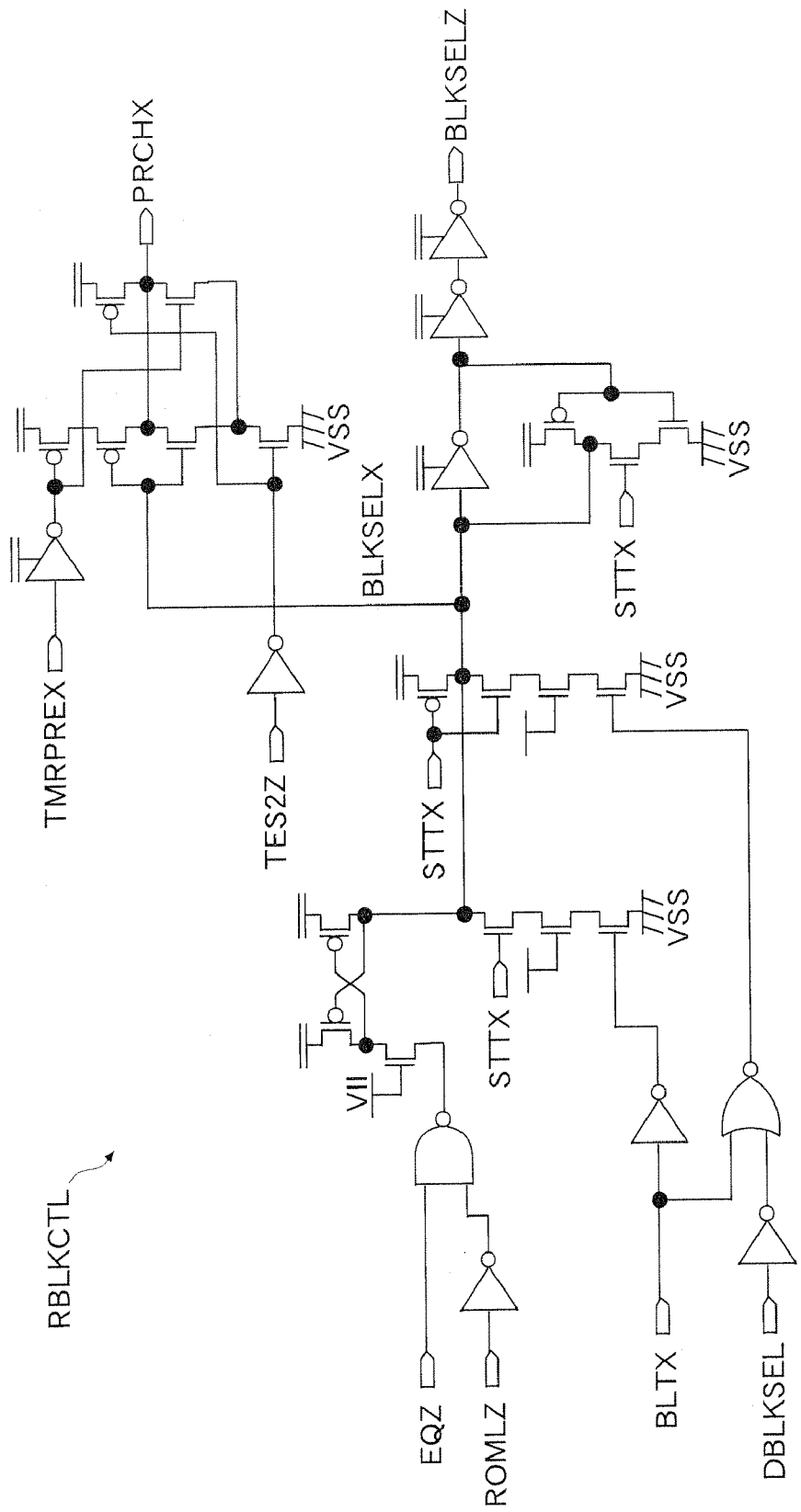
FIG. 9 illustrates details of a block control circuit shown in FIG. 4.

FIG. 9 illustrates details of the block control circuit RBLKCTL shown in FIG. 4. Power supply lines shown by doublets in the drawing represents boost voltage lines VPP (for example, 2.8 V). The block control circuit RBLKCTL activates the block selection signal BLKSELZ synchronously with the bit control signal BLTX, and inactivates the block selection signal BLKSELZ synchronously with the equalize control signal EQZ. The block control circuit RBLKCTL inactivates the precharge signal PRCHX during activation of the block selection signal BLKSELZ during the normal operation mode. The block selection signal BLKSELZ is activated for a predetermined period responding to the access request (the read command RD, the write command WR, or the refresh request RREQ). Accordingly, the precharge signal PRCHX is inactivated for a predetermined period responding to the access request.

Besides, the block control circuit RBLKCTL inactivates the precharge signal PRCHX synchronously with the activation of the block selection signal BLKSELZ, and activates the precharge signal PRCHX synchronously with the activation of the test precharge signal TMRPREX during the first test mode. The block control circuit RBLKCTL keeps the precharge signal PRCHX at high level during the second test mode. As stated above, the block control circuit RBLKCTL operates as a reset control circuit inactivating the precharge signal PRCHX (a second timing signal) for a predetermined period responding to the access request during the normal operation mode, and fixing the precharge signal PRCHX at the inactivation level (high level) during the second test mode.

Figure 10:
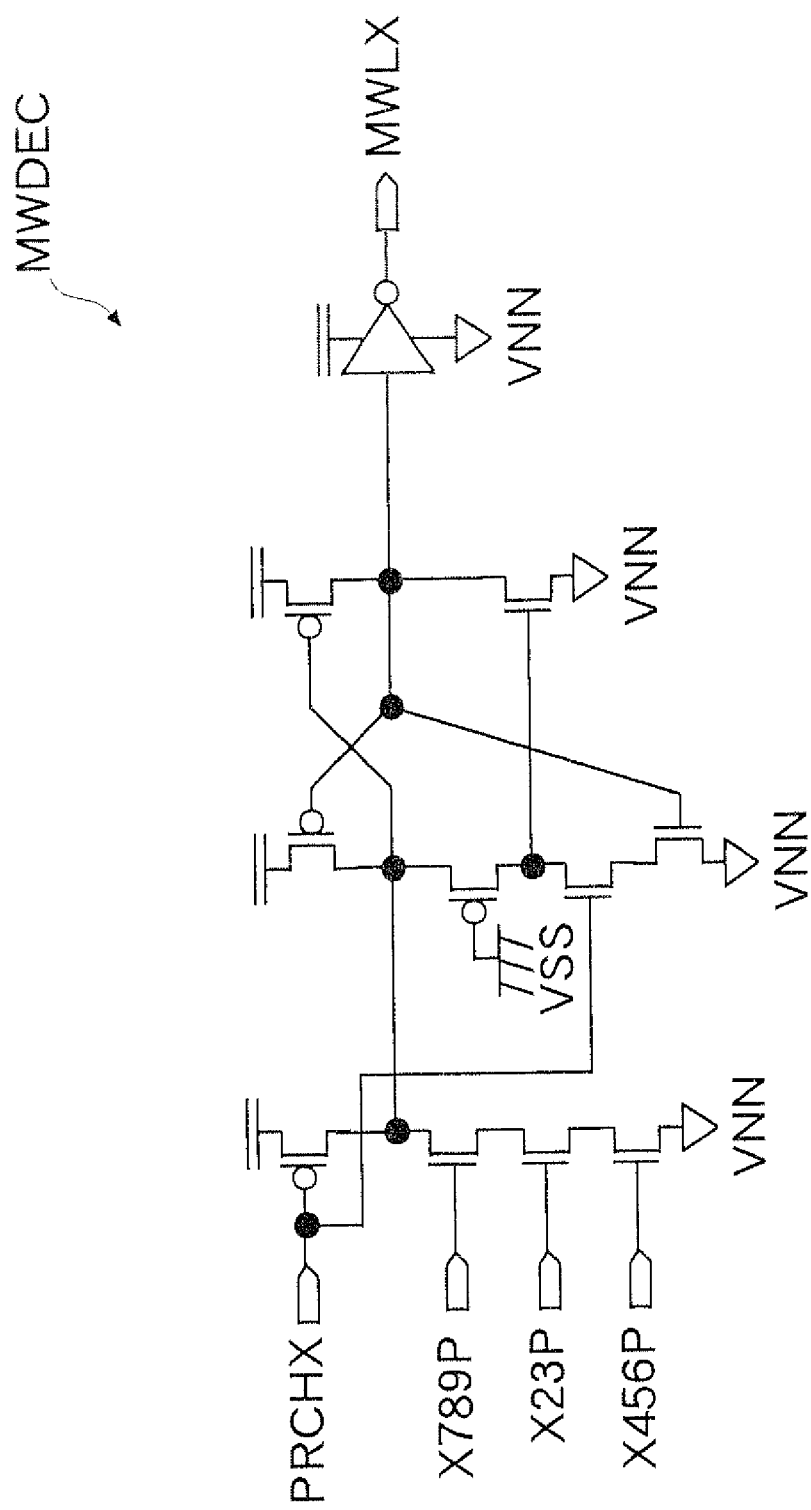
FIG. 10 illustrates details of a main word decoder shown in FIG. 4.

FIG. 10 illustrates details of the main word decoder MWDEC shown in FIG. 4. The main word decoder MWDEC is formed by respective main word lines MWLX (for example, 256 pieces by the respective row blocks RBLK0-1). The main word decoder MWDEC changes the main word line MWLX to an activation level when all of the corresponding decoded signals X23P, X456P, X789P change to high level, and changes the main word line MWLX to an inactivation level synchronously with the activation of the precharge signal PRCHX (the second timing signal).

An nMOS transistor receiving the decoded signals X23P, X456P, X789P (the address signals indicating the main word lines MWLX) at a gate thereof and an nMOS transistor receiving the precharge signal PRCHX at a gate thereof operate as set parts setting the main word lines MWLX at the activation level (low level) synchronously with the inactivation of the precharge signal PRCH. The decoded signal X23P is generated synchronously with the word enable signal WLENZ (the first timing signal) as shown in FIG. 7. Accordingly, the main word line MWLX is activated synchronously with the activation of the word enable signal WLENZ. A pMOS transistor receiving the precharge signal PRCHX at a gate thereof operates as a reset part resetting the main word line MWLX at the inactivation level (high level) synchronously with the activation of the precharge signal PRCHX.

Figure 11:
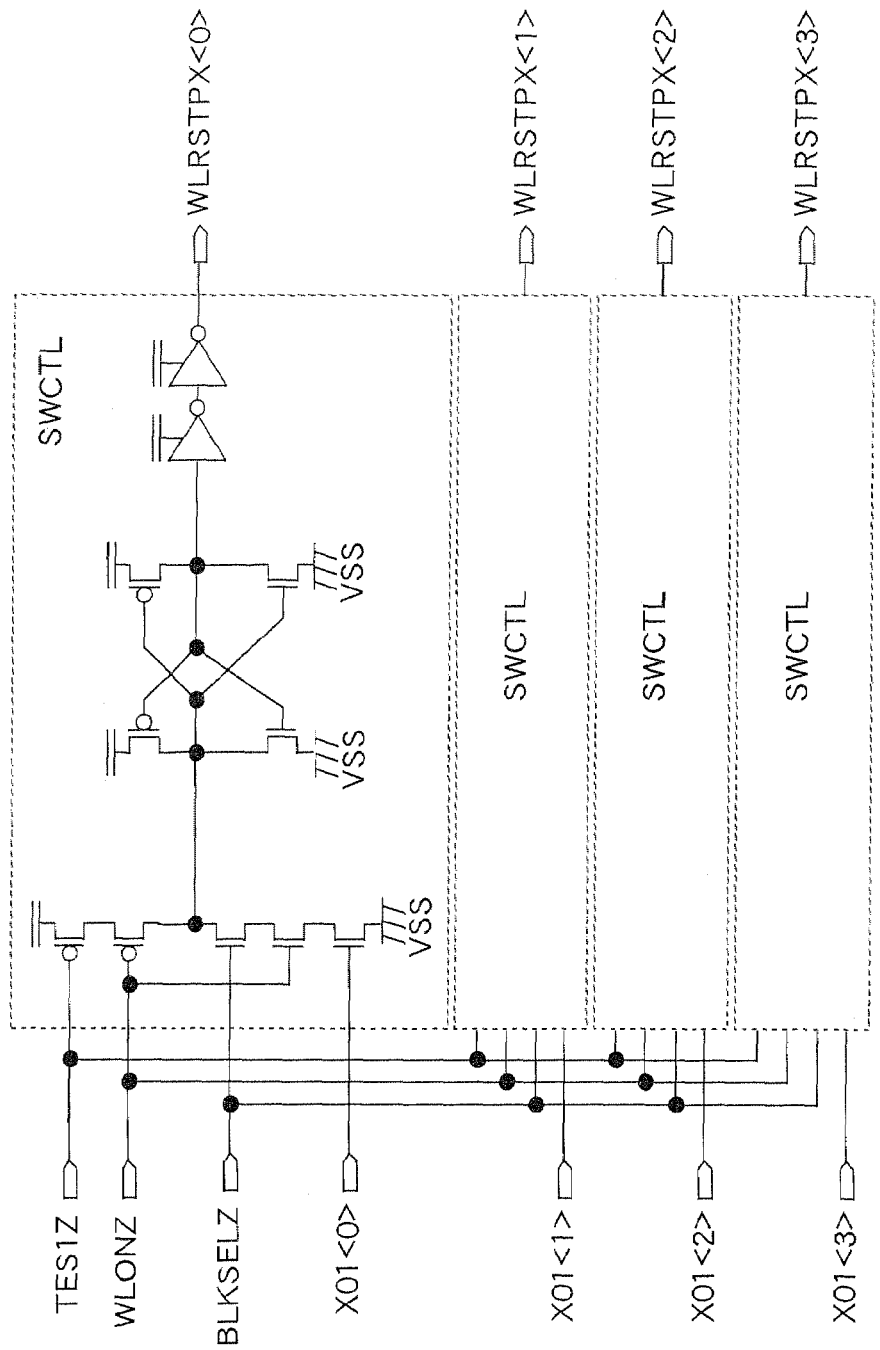
FIG. 11 illustrates details of a sub word control circuit shown in FIG. 4.

FIG. 11 illustrates details of the sub word control circuit SWCTL shown in FIG. 4. The sub word control circuits SWCTL are provided with corresponding to the sub word lines SWL shown in FIG. 12. The sub word control circuit SWCTL inactivates the word reset signal WLRSTPX synchronously with the block selection signal BLKSELZ, and activates the word reset signal WLRSTPX synchronously with an inactivation of the word control signal WLONZ, when a corresponding decoded signal X01 (an address signal indicating the sub word line SWL) changes to high level during the normal operation mode and the second test mode (TES1Z=low level). The sub word control circuit SWCTL inactivates the word reset signal WLRSTPX synchronously with the block selection signal BLKSELZ during the first test mode (TES1Z=high level), and thereafter, disables the activation of the word reset signal WLRSTPX, and keeps the word reset signal WLRSTPX at high level.

The nMOS transistor receiving the block selection signal BLKSELZ, the word control signal WLONZ, and the decoded signal X01 at a gate thereof operates as a reset part resetting the word reset signal WLRSTPX to the inactivation level (high level). The pMOS transistor receiving the word control signal WLONZ at a gate thereof operates as a set part setting the word reset signal line WLRSTPX at an activation level (low level). The pMOS transistor receiving the test signal TES1Z at the gate thereof operates as a set disable part disabling the set by the set part.

Figure 12:
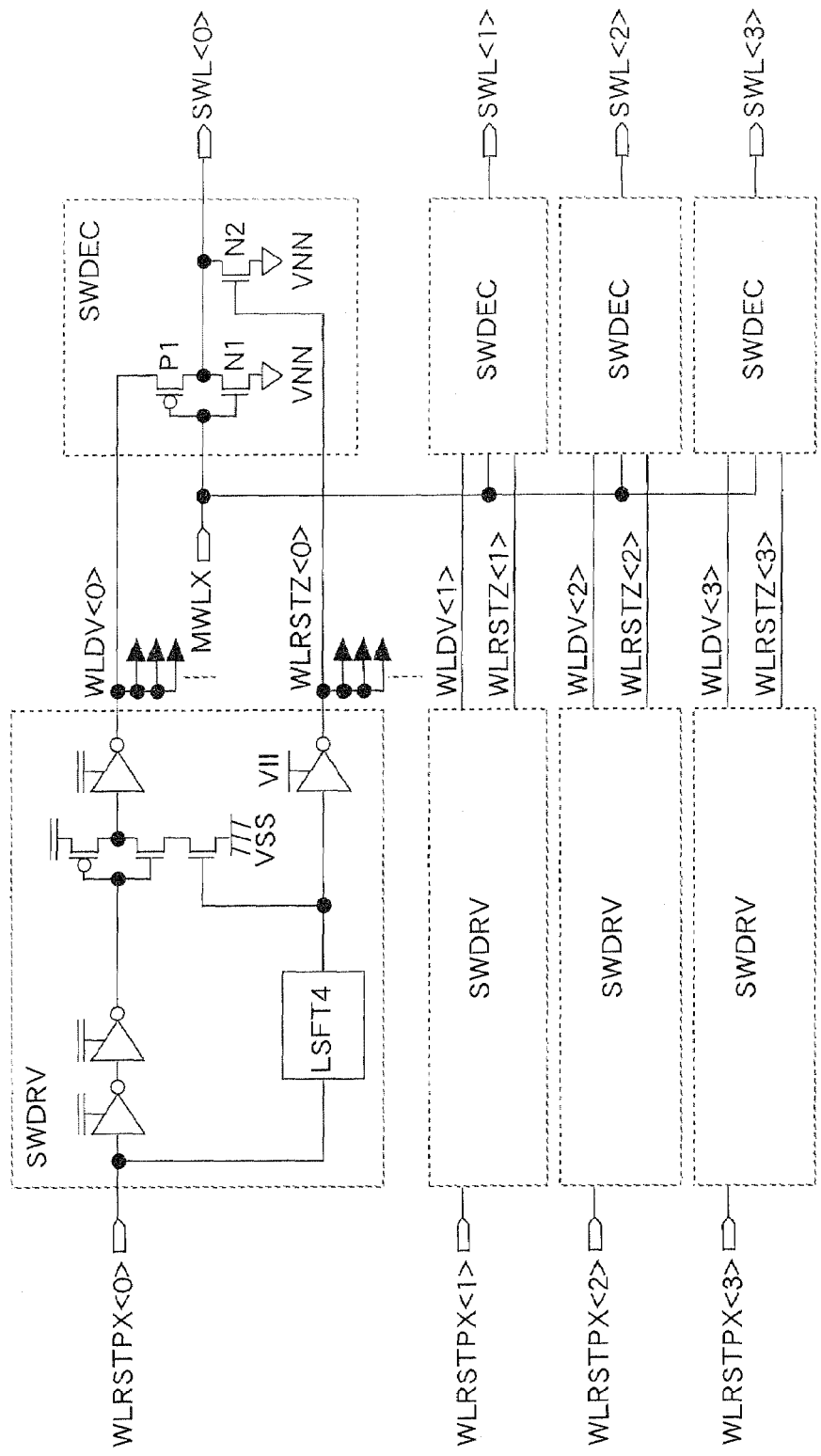
FIG. 12 illustrates details of a sub word driver and a sub word decoder shown in FIG. 4.

FIG. 12 illustrates details of the sub word driver SWDRV and the sub word decoder SWDEC shown in FIG. 4. The sub word driver SWDRV generates a word drive signal WLDV which is the same phase with the word reset signal WLRSTPX, and a word reset signal WLRSTZ in which a logic of the word reset signal WLRSTPX is inverted. For example, a high level voltage of the word drive signal WLDV is a boosted voltage VPP (for example, 2.8 V), and a high level voltage of the word reset signal WLRSTZ is an internal power supply voltage VII (for example, 1.6 V). The boosted voltage VPP is generated by a not-shown boost circuit by using an external power supply voltage VDD (for example, 1.8 V). The internal power supply voltage VII is generated by a not-shown internal power supply generation circuit by using the external power supply voltage VDD.

The sub word decoder SWDEC has a CMOS inverter in which a source of a pMOS transistor P1 (a first switch) is coupled to a word drive signal line WLDV and a source of an nMOS transistor N1 (a second switch) is coupled to a negative voltage line VNN, and an nMOS transistor N2 (a third switch)

in which a drain thereof is coupled to an output of the CMOS inverter (SWL), a source thereof is coupled to the negative voltage line VNN, and a gate thereof receives the word reset signal WLRSTZ. The negative voltage VNN is generated by a not-shown negative voltage generation circuit by using the external power supply voltage VDD.

The pMOS transistor P1 turns on when the main word line MWLX is at an activation level (low level), and couples the sub word line SWL to a high level voltage line WLDV. The nMOS transistor N1 turns on when the main word line MWLX is at the inactivation level (high level), and couples the sub word line SWL to the low level voltage line VNN. The nMOS transistor N2 turns on when the word reset signal WLRSTZ is at the activation level (high level), and couples the sub word line SWL to the low level voltage line VNN. Concretely speaking, the sub word decoder SWDEC changes the sub word line SWL to high level when the main word line MWLX is in low level and the word drive signal WLDV is in high level. Besides, the sub word decoder SWDEC changes the sub word line SWL to low level when the main word line MWLX is in low level and the word drive signal line WLDV is in low level, when the main word line MWLX is in high level, or when the word reset signal WLRSTZ is in high level.

Incidentally, in this embodiment, four sub word lines SWL<0-3> are wired by each main word line MWLX. The word drive signal WLDV and the word reset signal WLRSTZ are commonly wired to the plural sub word decoders SWDEC which are coupled to the different main word lines MWLX. For example, the word drive signal WLDV<0> and the word reset signal WLRSTZ<0> are commonly wired to 256 pieces of sub word decoders SWDEC at the respective row blocks RBLK0-1. Other word drive signals WLDV<1-3> and the word reset signals WLRSTZ<1-3> are the same.

Figure 13:
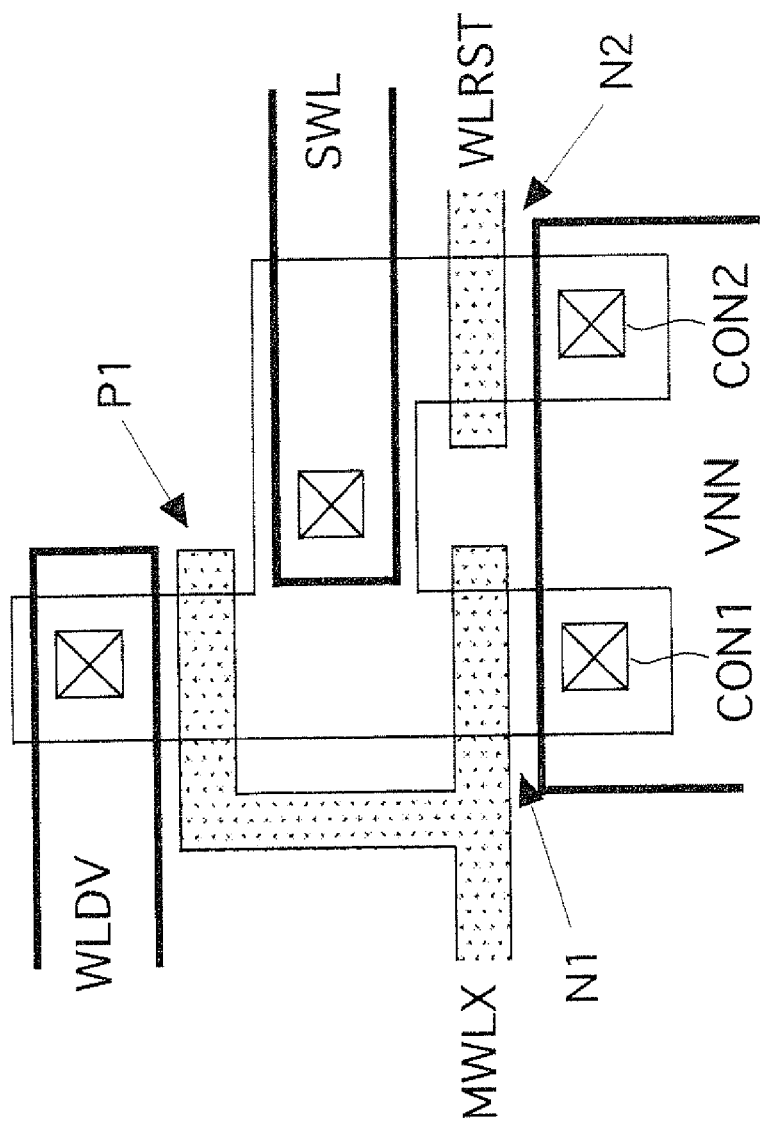
FIG. 13 illustrates the sub word decoder shown in FIG. 12.

FIG. 13 illustrates a layout of the sub word decoder SWDEC shown in FIG. 12. In the drawing, areas surrounded by heavy lines represent metal wirings, half-tone dot meshing areas represent gate wirings of transistors, and an area surrounded by a fine solid line represents a diffusion layer. The diffusion layer forms the source and drain of the transistor. Squares marked "X" represent contacts coupling the metal wirings to the diffusion layer. A contact CON1 couples the source of the nMOS transistor N1 to the negative voltage line VNN. A contact CON2 couples the source of the nMOS transistor N2 to the negative voltage line VNN.

Figure 14:
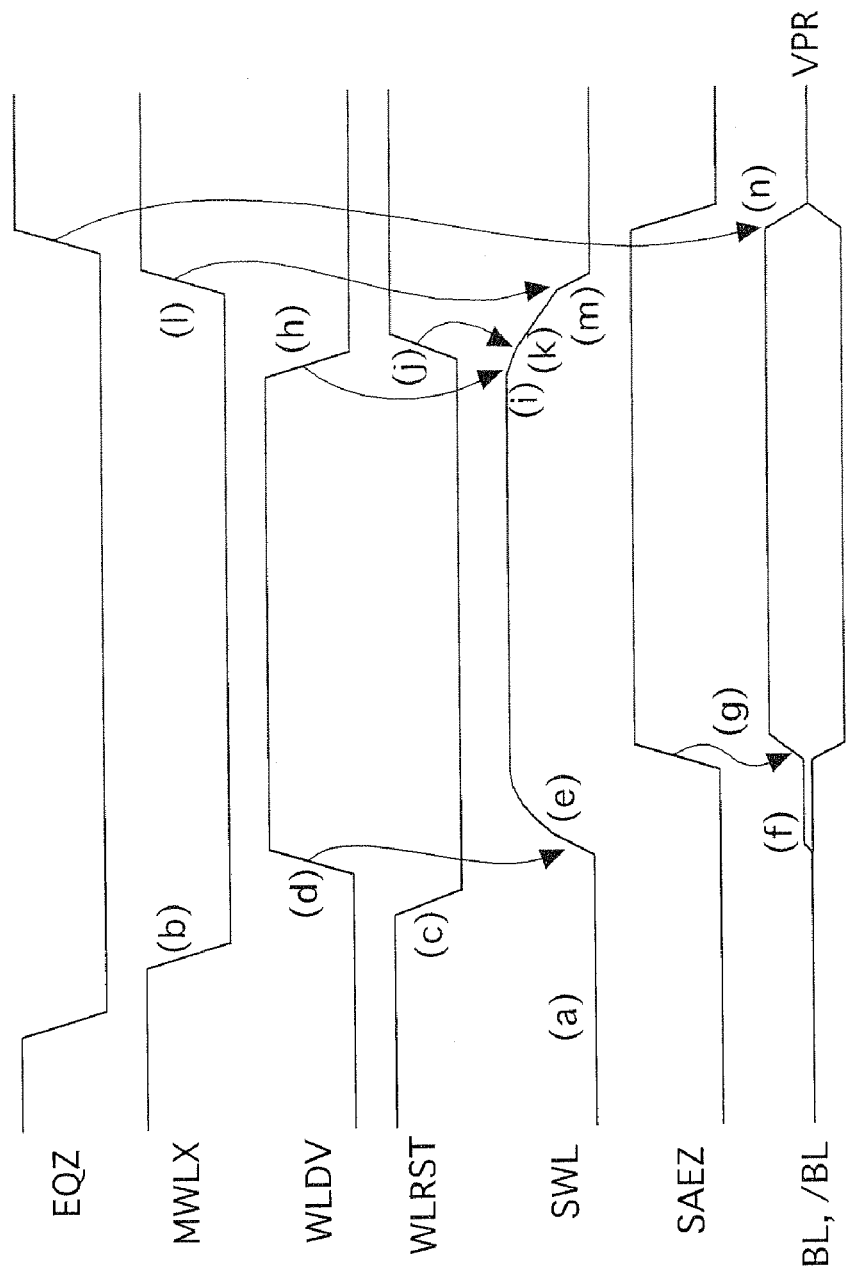
FIG. 14 illustrates a general access operation of a semiconductor memory of the first embodiment.

FIG. 14 illustrates a general access operation of the semiconductor memory MEM of the first embodiment. FIG. 14 shows waveforms under the normal operation mode when resistances of the contacts CON1, CON2 shown in FIG. 13 are normal.

In an initial state, the nMOS transistors N1, N2 in FIG. 12 turn on by the high level of the main word line MWLX and the high level of the word reset signal WLRSTZ, and the sub word line SWL is kept at the low level (FIG. 14 (a)). The main word line MWLX is activated, and the gate of the pMOS transistor P1 shown in FIG. 12 receives the low level (FIG. 14 (b)). At this time, the word drive signal line WLDV is in low level, and therefore, the pMOS transistor P1 turns off.

Next, the word reset signal WLRSTZ changes to low level, and the nMOS transistor N2 turns off (FIG. 14 (c)). Next, the word drive signal line WLDV changes to high level, and the pMOS transistor P1 turns on (FIG. 14 (d)). The sub word line SWL changes to high level by the turning on of the pMOS transistor P1 (FIG. 14 (e)). The transfer transistor of the memory cell MC turns on, and data are read from the memory cell MC to the bit line BL (or /BL) (FIG. 14 (f)). After that, the sense amplifier control signal SAEZ changes to high level, and a voltage difference between the pair of bit lines BL, /BL is amplified by the sense amplifier SA (FIG. 14 (g)).

When the access operation is completed, at first, the word drive signal line WLDV changes to low level (FIG. 14 (h)). The low level of the word drive signal line WLDV is transmitted to the sub word line SWL via the pMOS transistor P1, and the voltage of the sub word line SWL decreases little by little (FIG. 14 (i)). Next, the word reset signal WLRSTZ changes to high level, and the nMOS transistor N2 turns on (FIG. 14 (j)). The voltage of the sub word line SWL further decreases by the turning on of the nMOS transistor N2 (FIG. 14 (k)). Next, the main word line MWLX changes to high level, the pMOS transistor P1 turns off, and the nMOS transistor N1 turns on (FIG. 14 (l)). The sub word line SWL changes to low level (FIG. 14 (m)). After that, the equalize control signal EQZ changes to high level, and the pair of bit lines BL, /BL are equalized to a precharge voltage VPR (FIG. 14 (n)).

Figure 15:
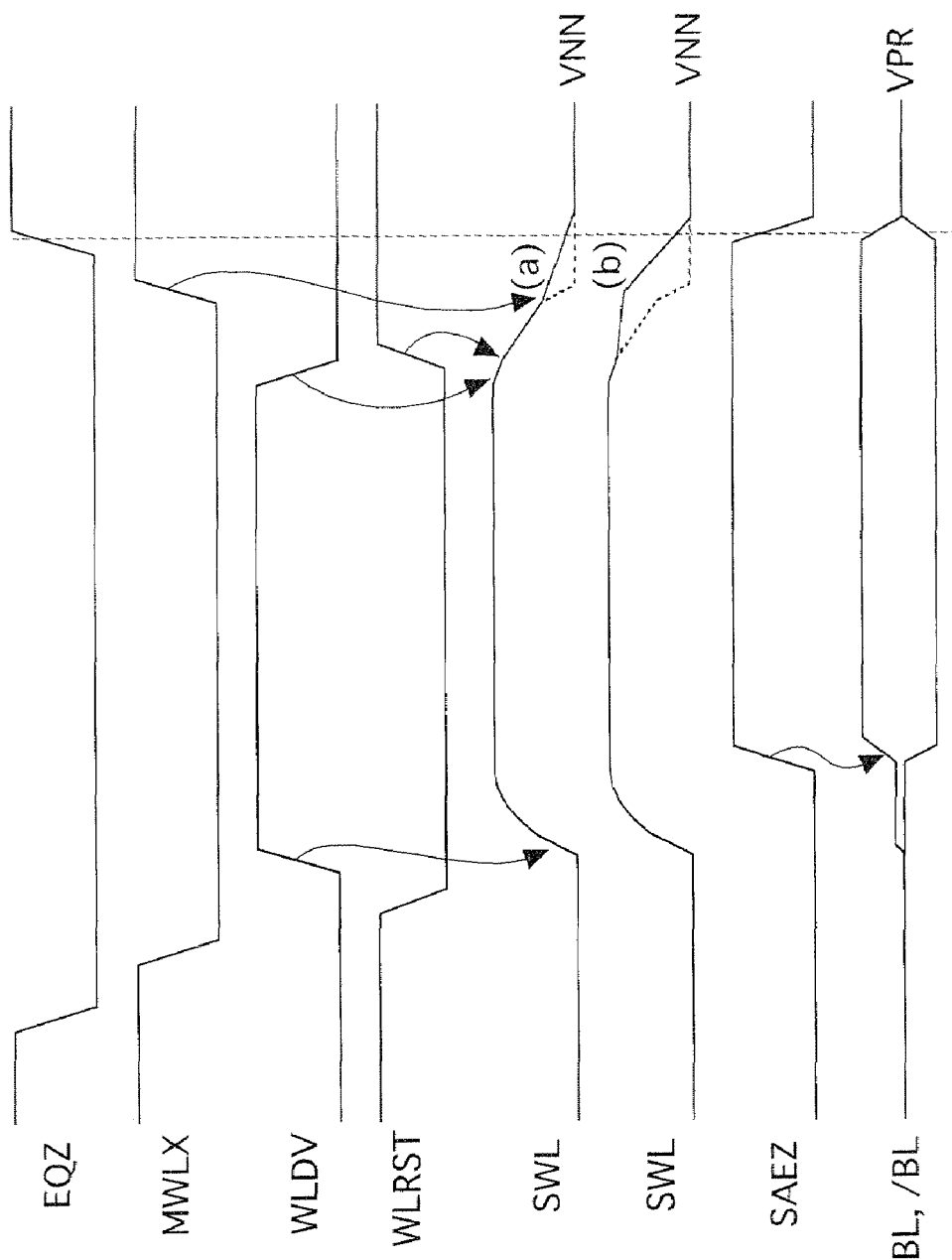
FIG. 15 illustrates an access operation in a normal operation mode when a resistance of a contact is high.

FIG. 15 illustrates an access operation under the normal operation mode when the resistance of the contact CON1 or the contact CON2 is high. A difference from FIG. 14 is a waveform of the sub word line SWL (a reset waveform) when the access operation is completed. The waveform of a dotted line of the sub word line SWL shows the waveform in FIG. 14.

When the resistance of the contact CON1 is high (FIG. 15 (a)), a current flows from the sub word line SWL to the negative voltage line VNN via the nMOS transistor N1 is small even if the main word line MWLX changes to high level and the nMOS transistor N1 turns on. Accordingly, it takes a time until the sub word line SWL changes to the negative voltage VNN. On the other hand, when the resistance of the contact CON2 is high (FIG. 15 (b)), the current flows from the sub word line SWL to the negative voltage line VNN via the nMOS transistor N2 is small even if the word reset signal WLRSTZ changes to high level and the nMOS transistor N2 turns on. Accordingly, it takes a time until the sub word line SWL changes to the negative voltage VNN.

When the voltage of the sub word line SWL (a reset voltage) does not decrease to the negative voltage line VNN at the time when the equalize control signal EQZ changes to high level, and the bit line BL (or /BL) begins to change to the precharge voltage VPR, namely, when the transfer transistor of the memory cell MC does not turn off, there is a possibility in which the data inside the memory cell MC may be lost, and a failure may occur because the voltage of a storage node of the memory cell MC changes by the precharge voltage VPR. Incidentally, in an example shown in the drawing, the sub word line SWL decreases almost until the negative voltage VNN at the start time of the precharge, and therefore, the failure may not occur. Accordingly, when the resistance of the contact CON1 is high, an acceleration test is performed by a later-described first test mode to acceleratory make the failure occur. Similarly, when the resistance of the contact CON2 is high, the acceleration test is performed by a later-described second test mode to acceleratory make the failure occur.

In general, when a resistance of a contact is higher than a reference value at a manufacturing time of a memory MEM, there is a case when the resistance may increase gradually in proportion to the use of the memory MEM. Namely, when the resistances of the contacts CON1, CON2 are high at the manufacturing time of the memory MEM, there is a possibility in which a reliability failure may occur after a shipment of the memory MEM. Incidentally, the failure in which the reset voltage of the sub word line SWL does not decrease until the negative voltage line VNN may occur also when a diffused resistor forming a source region is high at either of the nMOS transistors N1, N2. Otherwise, the failure may also occur when the transistors N1 or N2 does not turn on because the gate is not formed normally at either of the nMOS transistors N1, N2.

Figure 16:
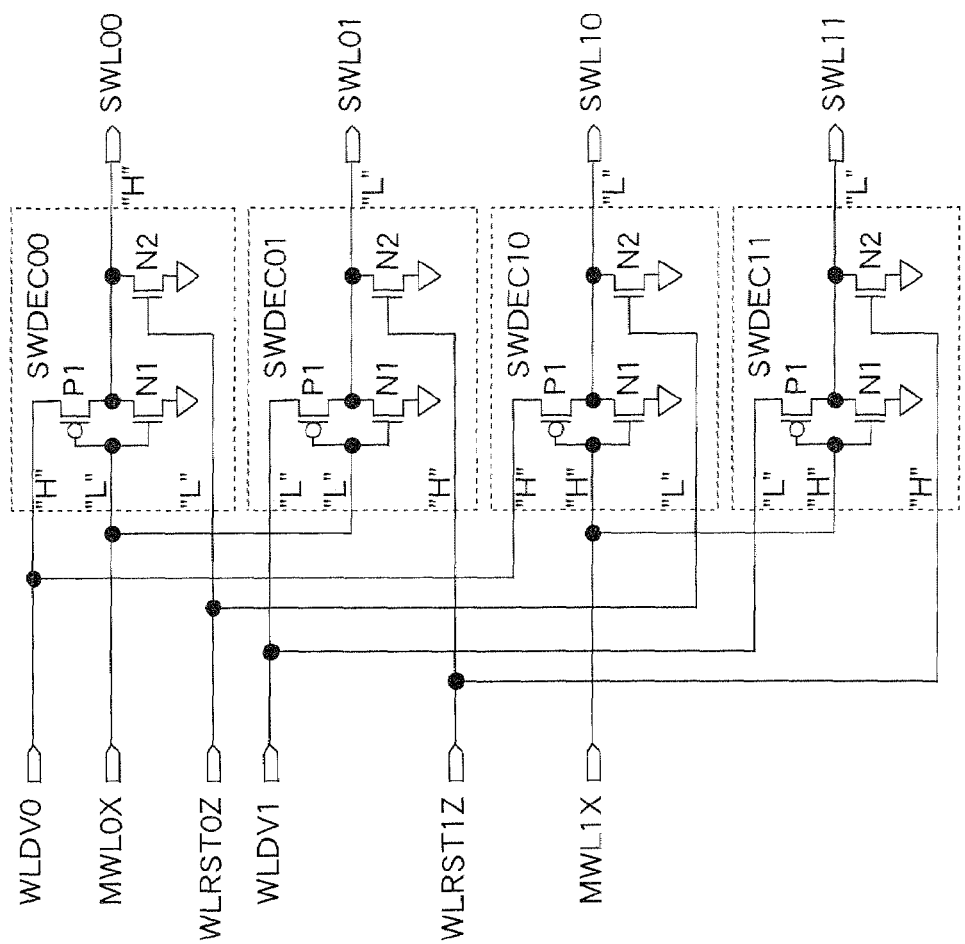
FIG. 16 illustrates an example of an arrangement of sub word decoders SWDEC.

FIG. 16 illustrates an example of an arrangement of the sub word decoders SWDEC. In this example, sub word drivers SWDRV00-01 and SWDRV10-11 respectively formed with corresponding to the plural main word lines MWL0X, MWL1X receive common word drive signal line WLDV0 (or WLDV1) and word reset signal WLRST0Z (or WLRST1Z). When the access operation of the memory cell MC coupled to the sub word line SWL is executed, a sub word decoder SWDEC00 receives the low level main word line MWL0X and the low level word reset signal WLRST0Z. A sub word decoder SWDEC10 receives the high level main word line MWL1X and the low level word reset signal WLRST0Z. When the resistance of the contact CON1 of the sub word decoder SWDEC10 is high, the sub word line SWL10 becomes in a floating state even though the main word line MWL1X is in high level at the sub word decoder SWDEC10 by keeping the main word line MWL0X at low level for a long time. If the transfer transistor of the memory cell MC coupled to the sub word line SWL10 turns on weakly, the data held in the memory cell MC are lost. Consequently, it becomes possible to detect the failure of the contact CON1 because error data are read by the subsequent read operation. However, it is necessary to keep the main word line MWL0X at low level for a long time to detect the failure, and a test time becomes long. As a result of this, a test cost increases.

Further, under a state in FIG. 16, the sub word decoder SWDEC01 receives the high level word reset signal WLRST1Z and the nMOS transistor N2 turns on. When the resistance of the contact CON2 of the sub word decoder SWDEC01 is high, the sub word line SWL01 becomes in a floating state at the sub word decoder SWDEC01 even though the word reset signal WLRST1Z is in high level, by keeping the main word line MWL0X at low level for a long time. Accordingly, the transfer transistor of the memory cell MC coupled to the sub word line SWL01 weakly turns on, and the data held in the memory cell MC are lost as same as in the above-stated case. In this case also, it is possible to detect the failure of the contact CON2, but it is necessary to keep the main word line MWLX at low level for a long time, and the test time becomes long. As a result, the test cost increases.

FIG. 17 illustrates a system SYS of the first embodiment. Note that in the embodiments which will be described later the same system as FIG. 4 is formed. The system is formed as, for example, a system in package SIP integrated on a silicon substrate. The SIP has the memory MEM illustrated in FIG. 1, a flash memory FLASH, a memory controller MCNT that accesses the flash memory FLASH, and a CPU (controller) that controls the entire system. The CPU, the memory MEM, and the memory controller MCNT are coupled to one another by a system bus SBUS. The SIP may be coupled to a higher rank system via an external bus. The SIP is a portable equipment such as a mobile phone or the like for example. The CPU outputs the chip enable signal /CE1, the command signal CMD, an address signal ADD, and the write data signal DQ in order to access the memory MEM and receives the read data signal DQ from the memory MEM.

Figure 18:
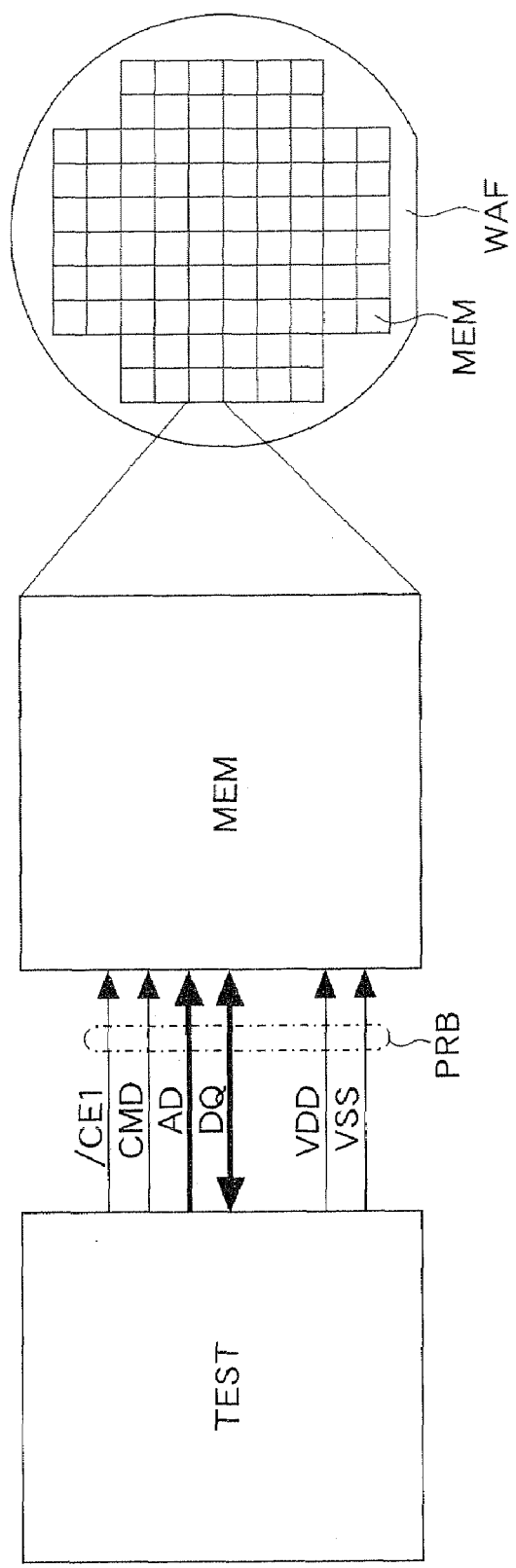
FIG. 18 illustrates a test system of the first embodiment.

FIG. 18 illustrates a test system of the first embodiment. First, a plurality of memories MEM are formed on a semiconductor wafer WAF through a semiconductor manufacturing process. The memories MEM are tested by an LSI tester TEST before being cut off from the wafer WAF. From the LSI tester TEST, not only a control signal but also power supply voltage VDD and ground voltage VSS are supplied. The memories MEM are coupled to the LSI tester TEST via, for example, probes PRB of a not-shown probe card. In FIG. 18, one memory MEM is coupled to the LST tester TEST, but a plurality of (four for example) memories MEM may be coupled at once to the LSI tester TEST. The number of the memories MEM coupled to the LSI tester TEST at once depends on the number of terminals of the LSI tester TEST and the number of terminals of the memory MEM. The LSI tester TEST supplies a chip enable signal /CE1, a command signal CMD, an address signal AD and a write data signal DQ to the memory MEM, and receives a read data signal DQ from the memory MEM.

FIG. 19 illustrates an access operation under the normal operation mode. In this example, the read command RD or the write command WR is supplied, or the refresh request RREQ occurs, and the read operation, the write operation, or the refresh operation of the row block RBLK0 is executed. An access cycle time from the access request to a completion of the access operation is, for example, 100 ns.

At first, an active signal ACTX in FIG. 5 is generated responding to the access request RD, WR, or RREQ, and the basic timing signals RASZ, ROMLZ, the bit control signals BLTZ, BLTX, the equalize control signal EQZ, the word control signal WLONZ, and the sense amplifier control signal SAEZ are sequentially activated (FIG. 19 (a)). During the normal operation mode, the test precharge signal TMRPREX is kept at high level (FIG. 19 (b)).

The block selection signal DBLKSEL corresponding to the row address signal RAD is activated synchronously with the basic timing signal RASZ (FIG. 19 (c)). The word enable signal WLENZ, the decoded signals X23P, X456P, X789P and the block selection signals BLKSELX, BLKSELZ are sequentially activated synchronously with the bit control signal BLTX (FIG. 19 (d)). Next, the main word lines MWLX corresponding to the decoded signals X23P, X456P, X789P are activated (FIG. 19 (e)). The precharge signal PRCHX and the precharge control signal BRS (BRS0 in this example) are inactivated synchronously with the block selection signal BLKSELZ (FIG. 19 (f)). A coupling between the bit lines BL, /BL executing the access operation and the precharge voltage line VPR is released by the inactivation of the precharge control signal BRS0. Besides, the switch control signal BT (BT1 in this example) corresponding to the bit lines BL, /BL which does not execute the access operation is inactivated synchronously with the block selection signal BLKSELZ (FIG. 19 (g)). Further, the word reset signal WLRSTPX is inactivated synchronously with the block selection signal BLKSELZ (FIG. 19 (h)).

The word drive signal line WLDV relating to the access operation changes to high level and the word reset signal WLRSTZ changes to low level synchronously with the inactivation of the word reset signal WLRSTPX (FIG. 19 (i)). After that, the sub word line SWL is activated as same as in FIG. 14, and the data is read from the memory cell MC to the bit line BL (or /BL) (FIG. 19 (j)). Besides, the sense amplifier control signal SAEZ is activated after a predetermined time from the activation of the word control signal WLONZ (FIG. 19 (k)), and a voltage difference between the pair of bit lines BL, /BL (a signal amount read from the memory cell MC to the bit line BL (or /BL)) is amplified at the sense amplifier SA (FIG. 19 (l)).

The precharge signal PREX is temporary activated after a predetermined time from the start of the access operation (FIG. 19 (m)), and the basic timing signal RASZ is inactivated (FIG. 19 (n)). The word control signal WLONZ, the block selection signal DBLKSEL, the basic timing signal ROMLZ, the bit control signals BLTZ, BLTX, the equalize control signal EQZ are sequentially inactivated synchronously with the inactivation of the basic timing signal RASZ (FIG. 19 (o)). The word enable signal WLENZ and the decoded signals X23P, X456P, X789P are sequentially inactivated synchronously with the inactivation of the block selection signal DBLKSEL (FIG. 19 (p)). The word reset signal WLRSTPX is activated synchronously with the inactivation of the word control signal WLONZ (FIG. 19 (q)). The word drive signal line WLDV changes to low level and the word reset signal WLRSTZ changes to high level synchronously with the activation of the word reset signal WLRSTPX (FIG. 19 (r)). After that, the sub word line SWL changes to low level by the word drive signal line WLDV and the word reset signal WLRSTZ as same as in FIG. 14, and a coupling between the storage node (capacitor) of the memory cell MC and the bit line BL (or /BL) is released (FIG. 19 (s)).

Next, the sense amplifier control signal SAEZ, the block selection signals BLKSELX, BLKSELZ are sequentially inactivated synchronously with the activation of the equalize control signal EQZ, and the precharge signal PRCHX and the precharge control signal BRS (BRS0 in this example) are activated (FIG. 19 (t)). The bit lines BL, /BL are coupled to the precharge voltage line VPR, and change to the precharge voltage VPR (FIG. 19 (u)).

FIG. 20 illustrates an access operation under the first test mode. Detailed descriptions are not given as for the same operations as in FIG. 19. The operations in FIG. 20 are executed when the tester TEST shown in FIG. 18 gives access to the memory MEM. The dotted lines shown on the signals RASZ, MWLX, SWL, WLRSTPX, WLDV, and WLRST represent waveforms during the normal operation mode. In the first test mode, for example, the write command WR for the row block RBLK0 is supplied from the LSI tester TEST. Incidentally, when an expected value is already written to the memory cell MC, the read command RD may be supplied. The access cycle time from the access request to the completion of the access operation is, for example, 100 ns.

In the first test mode, the sense amplifier control signal SAEZ is activated later than in the normal operation mode by the delay circuit DLY4 in FIG. 6 (FIG. 20 (a)). The test precharge signal TMRPREX is inactivated from low level to high level synchronously with the basic timing signal ROMLZ (FIG. 20 (b)). The word enable signal WLENZ is activated synchronously with not the bit control signal BLTX but the word control signal WLONZ (FIG. 20 (c)). Accordingly, the activation timings of the main word line MWLX and the sub word line SWL become late compared to the normal operation mode (FIG. 20 (d, e)). Namely, in the first test mode, the activation timings of the main word line MWLX, the sub word line SWL, and the sense amplifier control signal SAEZ become late compared to the normal operation mode at the start time of the access operation. Incidentally, the reason thereof will be described in FIG. 21.

Next, when the precharge signal PREX is temporary activated after a predetermined time from the start of the access operation, the test precharge signal TMRPREX is activated to the low level (FIG. 20 (f)). The precharge signal PRCHX is activated synchronously with the activation of the test precharge signal TMRPREX (FIG. 20 (g)), and the main word line MWLX is inactivated (FIG. 20 (h)). Besides, the sub word control circuit SWCTL in FIG. 11 disables the activation of the word reset signal WLRSTPX during the first test mode (FIG. 20 (i)). After that, the word drive signal WLDV is kept at high level and the word reset signal WLRSTZ is kept at low level during the first test mode (FIG. 20 (j)).

Accordingly, in the first test mode, the sub word line SWL changes to low level (FIG. 20 (k)) only by the change of the main word line MWLX to high level, namely, only by the nMOS transistor N1 in FIG. 12. The inactivation timing of the main word line MWLX is set earlier compared to FIG. 19 so as to match the inactivation timing of the sub word line SWL with the normal operation mode time.

When the resistance of the contact CON1 is normal, the sub word line SWL changes to low level (a reset level) slightly later than in FIG. 19. In the first test mode, the inactivation of the sub word line SWL is made relatively early in consideration with the delay of the reset timing of the sub word line SWL. In other words, the time from the inactivation of the sub word line SWL to the start of the precharge of the bit lines BL, /BL (a rising edge of the precharge control signal BRS) is elongated compared to the normal operation mode. Accordingly, in the access operation (the write operation or the read operation) using the sub word decoder SWDEC in which the resistance of the contact CON1 is normal, it can be prevented that the bit lines BL, /BL are precharged before the sub word line SWL is completely reset. Namely, it is possible to prevent that the data held in the memory cell MC corresponding to the normal sub word decoder SWDEC are lost.

On the other hand, when the resistance of the contact CON1 is higher than a normal value, the sub word line SWL gradually changes to low level as shown by a heavy solid line in the drawing. When the level of the sub word line SWL is higher than the low level voltage VNN at the timing of the rising edge of the precharge control signal BRS, the transfer transistor of the memory cell MC weakly turns on, and the data held in the memory cell MC are lost. The lost of data, namely, the abnormal state of the resistance of the contact CON1 can be determined when the data read from the memory cell MC by the next read operation is different from the expected value. As stated above, in the first test mode, it is possible to judge whether the resistance of the contact CON1 of the sub word decoder SWDEC is higher than the normal value or not, by executing the two times access cycles (200 ns in this example). The sub word decoder SWDEC in failure is replaced by a redundancy circuit in a subsequent relief process.

Incidentally, in the first test mode, plural access operations may be executed continuously while sequentially updating the values of the selected main word line MWLX as shown in later-described FIG. 22. Besides, in the first test mode, a refresh disable bit of the test mode register 12 is set to disable the self refresh operation. Accordingly, it is possible to prevent that levels of the unintentional word drive signal WLDV and the word reset signal WLRSTZ may be fixed by the refresh operation during the first test mode.

FIG. 21 illustrates another access operation in the first test mode. The operations in FIG. 21 are executed when the tester TEST shown in FIG. 18 gives access to the memory MEM. FIG. 21 illustrates waveforms of the access operation when a failure of another sub word decoder SWDEC is detected under a state of entering the first test mode after the test shown in FIG. 20. Accordingly, the word reset signal WLRSTPX and the word drive signal line WLDV are fixed to high level, and the word reset signal line WLRSTZ is fixed to low level (FIG. 21 (a)). Other waveforms are the same as FIG. 20.

The access operation in FIG. 21 is valid when the common word drive signal line WLDV0 (or WLDV1) and the word reset signal line WLRST0Z (or WLRST1Z) are coupled to the plural sub word decoders SWDEC which are coupled to the main word lines MWLX different from one another as shown in FIG. 16.

For example, the sub word line SWL00 in FIG. 16 is accessed by the access operation in FIG. 20, and the sub word decoder SWDEC00 is tested. After the test, the word drive signal line WLDV0 is fixed to high level, and the word reset signal WLRST0Z is fixed to low level. The sub word line SWL10 is accessed by the access operation in FIG. 21 under the state as stated above, and thereby, the test of the sub word decoder SWDEC10 can be performed. As shown in FIG. 12, the pair of word drive signal line WLDV and the word reset signal line WLRSTZ are coupled to the 256 pieces of sub word decoders SWDEC in which the main word lines MWLX are different from one another. Consequently, in the first test mode, the access operation is executed while switching the main word lines MWLX sequentially, and thereby, it is possible to test the plural sub word decoders SWDEC. In this embodiment, it is possible to test all of the sub word decoders SWDEC by entering the first test mode for eight times (four times per respective row blocks RBLK0-1).

Incidentally, in the access operation after the second time or later in the first test mode, the word drive signal WLDV is fixed to high level, and therefore, the sub word line SWL is activated not when the word drive signal WLDV changes to high level but when the main word line MWLX changes to low level (FIG. 21 (b)). When the main word line MWLX is activated at the timing shown in FIG. 19 (e), the activation timing of the sub word line SWL becomes relatively early. If the sub word line SWL is activated before the precharge operations of the bit lines BL, /BL are stopped, the data held in the memory cell MC are lost. In the first test mode, the activation timing of the main word line MWLX is delayed compared to the normal operation mode to prevent the lost of data (FIG. 21 (c)).

Figure 22:
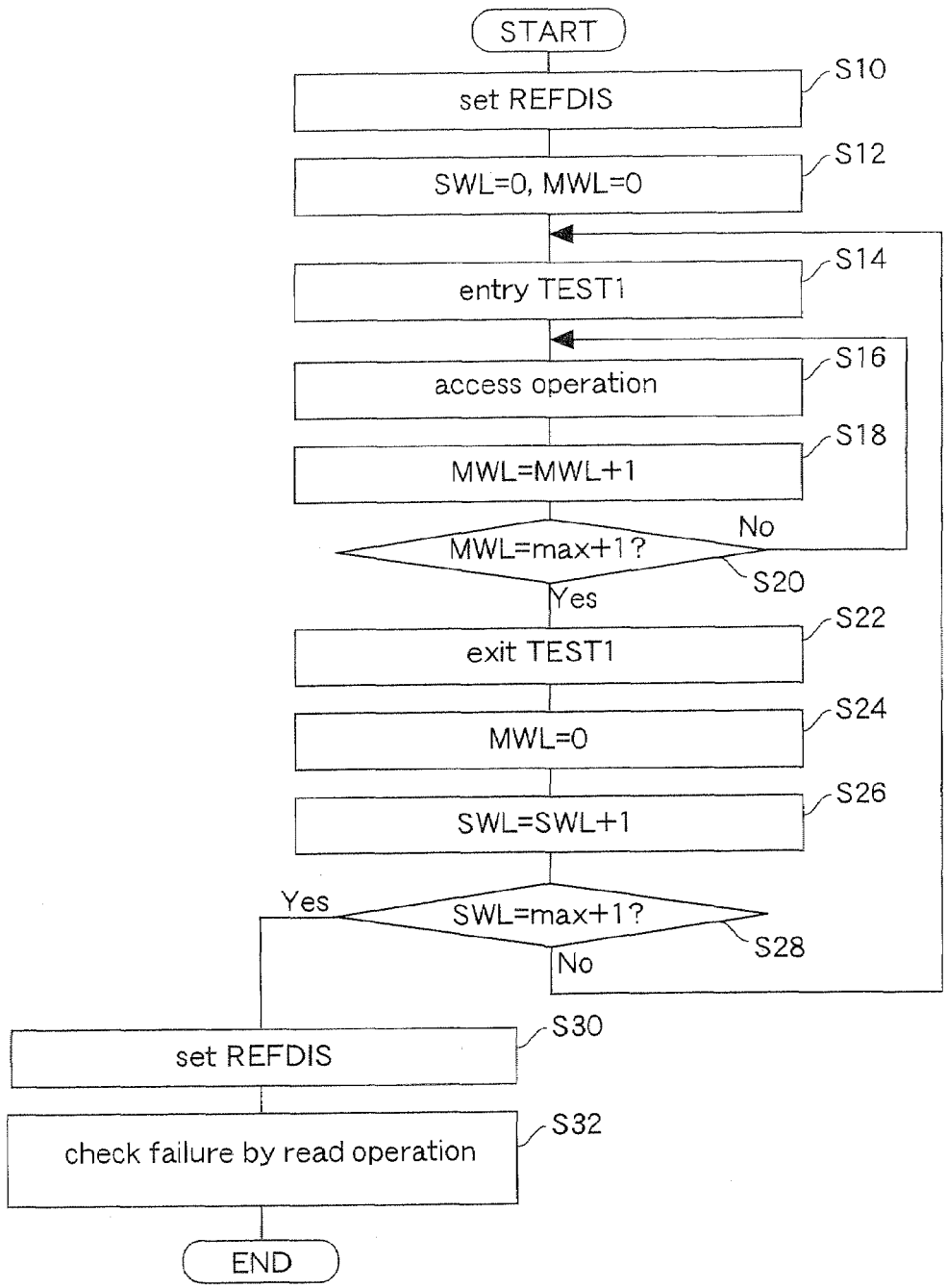
FIG. 22 illustrates an operation in the first test mode.

FIG. 22 illustrates operations in the first test mode. The flow in FIG. 22 is performed by a test program of the tester TEST shown in FIG. 18. At first, the tester TEST sets the refresh disable bit (REFDIS=high level) at step S10 by supplying an address signal AD together with the test mode register set command TMRS to the memory MEM. It becomes thereby possible to prevent that the refresh operation is executed during the first test mode, and that the levels of the unintentional word drive signal WLDV and the word reset signal WLRSTZ are fixed. Next, in step S12, values indicating the sub word line SWL and the main word line MWLX to be accessed are respectively set to be "0" by using a register and so on inside the tester TEST.

Next, at step S14, the address signal AD together with the test mode register set command TMRS are supplied to the memory MEM, and a TEST1 bit indicating the first test mode in the test mode register 12 is set. The operation mode of the memory MEM transfers from the normal operation mode to the first test mode by the set of the TEST1 bit. After that, at step S16, the access operations shown in FIG. 20 and FIG. 21 are executed. After the first access operation is completed, a value indicating the main word line MWLX is increased by "1" at step S18. When the value indicating the main word line MWLX does not exceed a maximum value at step S20, the process returns to the step S16. When the value indicating the main word line MWLX exceeds the maximum value, the process transfers to step S22.

At the step S22, the TEST1 bit in the test mode register 12 is reset by the test mode register set command TMRS. The memory MEM exits from the first test mode, and returns to the normal operation mode. Accordingly, the word drive signal WLDV fixed to high level returns to low level, and the word reset signal WLRSTZ fixed to low level returns to high level. Namely, the sub word control circuit SWCTL, the sub word driver SWDRV, and the sub word decoder SWDEC are initialized.

Next, at step S24, the value indicating the main word line MWLX is set to be "0". At step S26, a value indicating the sub word line SWL is increased by "1". When the value showing the sub word line SWL does not exceed a maximum value at step S28, the process returns to the step S14. When the value indicating the sub word line SWL exceeds the maximum value, it is determined that all of the sub word decoders SWDEC are tested, and the process transfers to step S30.

At the step S30, the refresh disable bit is reset by the test mode register set command TMRS (REFDIS=low level), and the execution of the refresh operation is allowed. Accordingly, it is prevented that the refresh operation is not executed in the following processes, and it becomes possible to prevent that the data held in the memory cell MC are lost.

At step S32, all of the sub word lines SWL are accessed sequentially, and the read operations are executed. Values respectively read from the memory cells MC are compared with the expected values, and it is judged whether the contacts CON1 of the sub word decoders SWDEC are in failure or not. The sub word decoder SWDEC judged to be in failure is relieved by using the redundancy circuit. As stated above, in this embodiment, it is possible to test all of the sub word decoders SWDEC by entering the first test mode for eight times (four times per the respective row blocks RBLK0-1).

Figure 23:
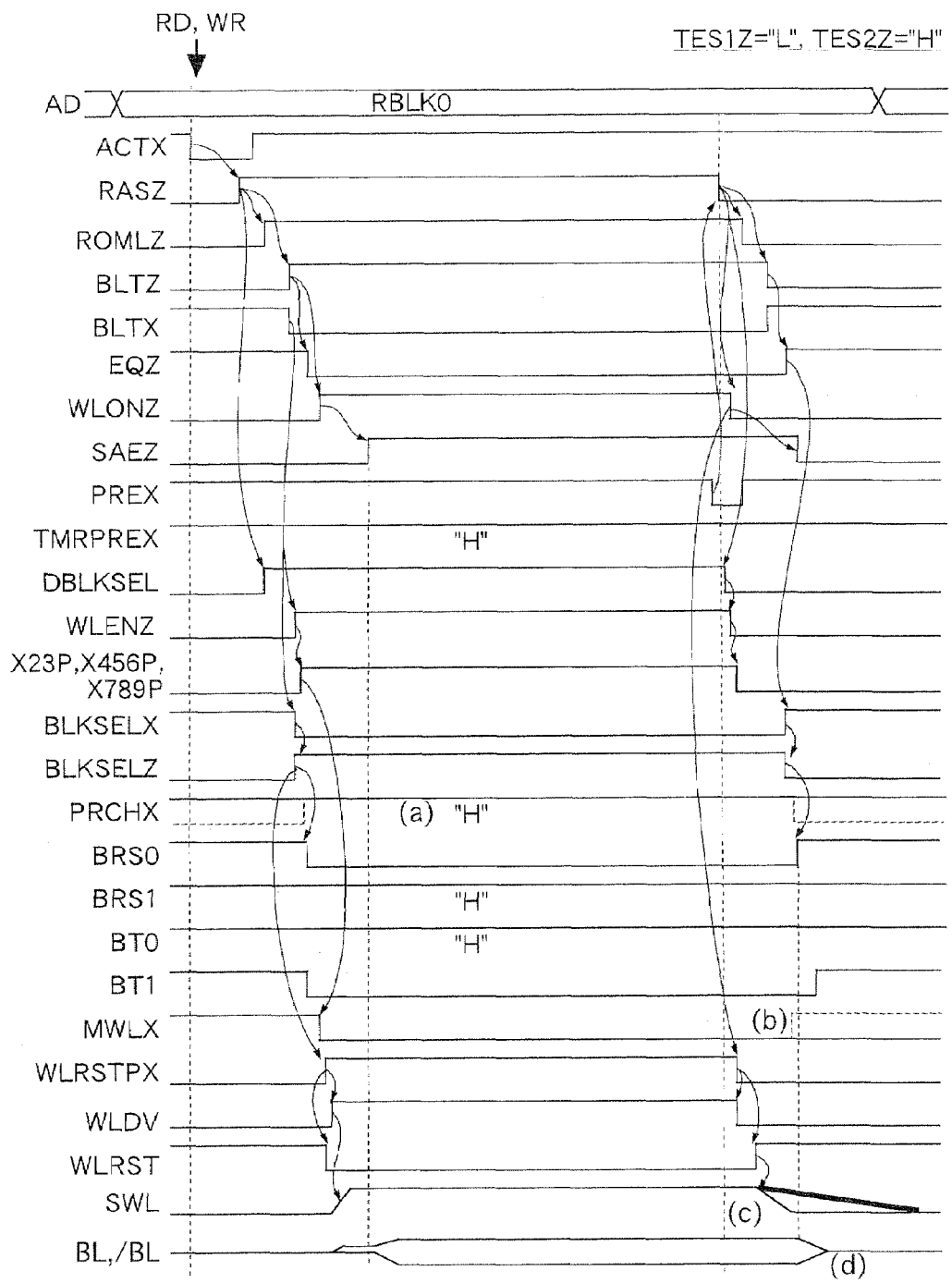
FIG. 23 illustrates an access operation in a second test mode.

FIG. 23 illustrates an access operation in a second test mode. Detailed descriptions are not given as for the same operations as in FIG. 19. Dotted lines shown on the signals PRCHX, MWLX illustrate waveforms during the normal operation mode. In the second test mode, for example, the write command WR for the row block RBLK0 is supplied from the LSI tester TEST. Incidentally, when the expected value is already written to the memory cell MC, the read command RD may be supplied. The access cycle time from the access request to the completion of the access operation is, for example, 100 ns. Incidentally, the refresh disable bit of the test mode register 12 is set to disable the self refresh operation also in the second test mode. Accordingly, it is possible to prevent that the unintentional main word line MWLX is fixed to low level by the refresh operation, and that the plural sub word lines SWL are activated at the same time during the second test mode.

During the second test mode, the block control circuit RBLKCTL shown in FIG. 9 fixes the precharge signal PRCHX at high level (FIG. 23(a)). Accordingly, the main word line MWLX which is activated once is not inactivated, and keeps the low level (FIG. 23(b)). The nMOS transistor N1 of the sub word decoder SWDEC (FIG. 12) constantly turns off after the start of the first access operation by the low-level main word line MWLX.

Accordingly, the sub word line SWL changes to low level only by the change of the word reset signal line WLRSTZ to high level, namely, only by the nMOS transistor N2 in FIG. 12, in the second test mode (FIG. 23(c)). The reset of the sub word line SWL is started by the change of the word reset signal line WLRSTZ to high level as same as in FIG. 19. Accordingly, when the resistance of the contact CON2 is normal, the bit lines BL, /BL are precharged after the sub word line SWL is completely reset (FIG. 23(d)). Namely, it is possible to prevent that the data held in the memory cell MC corresponding to the normal sub word decoder SWDEC are lost.

On the other hand, when the resistance of the contact CON2 is higher than the normal value, the sub word line SWL changes to low level gradually as shown in a heavy solid line in the drawing. When the level of the sub word line SWL is higher than the low level voltage VNN at a timing of a rising edge of the precharge control signal BRS, the transfer transistor of the memory cell MC weakly turns on, and the data held in the memory cell MC are lost. The lost of data, namely, an abnormal state of the resistance of the contact CON2 is determined when the expected value cannot be read from the memory cell MC by the next read operation. As stated above, in the second test mode, it is possible to judge whether the resistance of the contact CON2 of the sub word decoder SWDEC is higher than the normal value or not by executing the two times access cycles (200 ns in this example). The sub word decoder SWDEC in failure is replaced by the redundancy circuit in the subsequent relief process.

As stated above, in the first embodiment, it is possible to detect the operation failure of the sub word decoder SWDEC easily and in a short time by forcibly turning off the nMOS transistor N2 of the sub word decoder SWDEC during the first test mode. Similarly, it is possible to detect the operation failure of the sub word decoder SWDEC easily and in a short time by forcibly turning off the nMOS transistor N1 of the sub word decoder SWDEC during the second test mode. It is possible to perform the acceleration test by the forcibly turning off of the nMOS transistors N1, N2, and therefore, an occurrence rate of a reliability failure of a semiconductor memory can be decreased.

Figure 24:
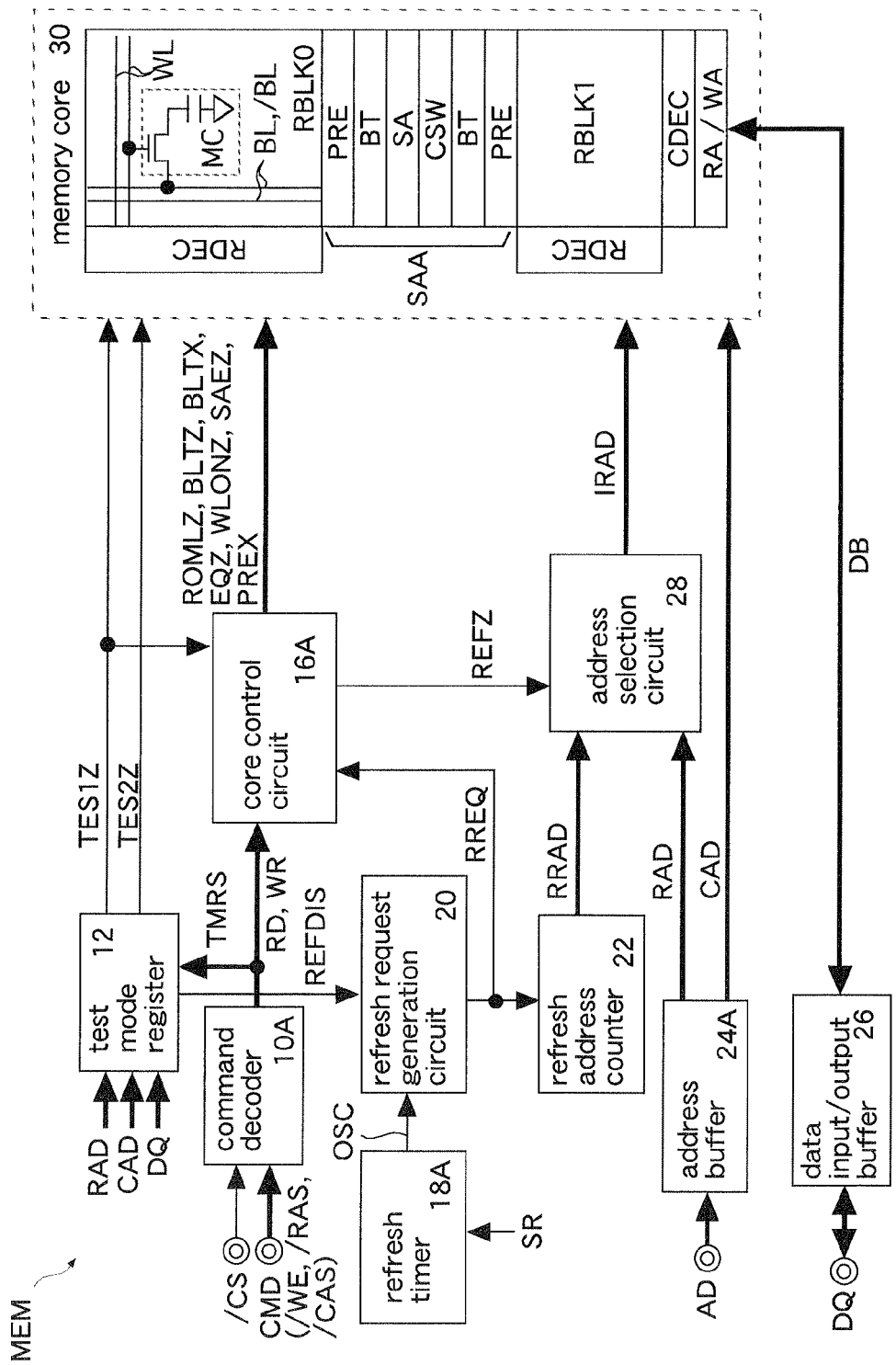
FIG. 24 illustrates a second embodiment of the present invention.

FIG. 24 illustrates a second embodiment. The same reference numerals and symbols are used to designate the same and corresponding elements which are described in the first embodiment, and the detailed description thereof will not be given. In this embodiment, the semiconductor memory MEM is a DRAM. The semiconductor memory MEM has a command decoder 10A, a core control circuit 16A, a refresh timer 18A and an address buffer 24A instead of the command decoder 10, the core control circuit 16, the refresh timer 18 and the address buffer 24 of the first embodiment. The other configurations are the same as the first embodiment. The memory MEM has not-shown redundancy circuit, redundancy fuse circuit and redundancy control circuit to relief the memory cell in failure and so on. The above-described FIG. 2 to FIG. 23 are also applied to this embodiment. However, in the system shown in FIG. 17 and the test system shown in FIG. 18, a signal to access to the DRAM is supplied to the memory MEM.

The command decoder 10A outputs commands recognized in accordance with logical levels of a chip select signal /CS and the command signal CMD as the read command RD, the write command WR and a refresh command REF (the external refresh request) to execute the access operation of the memory core 30, the test mode register set command TMRS to set the test mode register 12, or the like. A function of the chip select signal /CS is the same as the chip enable signal /CE1. The command signal CMS includes, for example, a write enable signal /WE, a row address strobe signal /RAS and a column address strobe signal /CAS.

The core control circuit 16A is included by excluding the arbiter 14 from the core control circuit 16 of the first embodiment. A refresh signal REFZ is generated responding to the refresh command REF or the refresh request RREQ. The refresh timer 18A generates the oscillation signal OSC only for a period while a self refresh signal SR showing a self refresh mode is received. The oscillation signal OSC is not generated during the normal operation mode when the read command RD, the write command WR, and the refresh command REF can be supplied. When the self refresh command is received during the normal operation mode, the memory MEM enters the self refresh mode.

The address buffer 24A receives the row address signal RAD and the column address signal CAD sequentially supplied to a common address terminal. Namely, this memory MEM adopts an address multiplex method. As stated above, the same effects as the above-stated first embodiment can be obtained also in the second embodiment. Namely, in the DRAM, it is also possible to perform the acceleration test by the forcible turning off the nMOS transistors N1, N2, and to decrease the occurrence rate of the reliability failure of the semiconductor memory.

Incidentally, in the above-stated embodiments, examples applied to a clock asynchronous type semiconductor memory is described. However, the present application is not limited to the above-stated embodiments. For example, the above-stated embodiments may be applied to a clock synchronous type semiconductor memory.

A proposition of the embodiments is to detect an operation failure of a sub word decoder easily and in a short time, and to decrease an occurrence rate of a reliability failure.

For example, when the sub word line cannot be coupled to the low-level voltage line via the third switch (or the second switch) resulting from a failure, the sub word line becomes difficult to be reset to low level by entering the test mode and disabling the turning on of the second switch (or the third switch). Accordingly, the transfer transistor cannot be surely turned off, and data held in the memory cell may be lost by an execution of an access operation. After exiting from the test mode, a read operation is executed, and the failure of the sub word decoder is detected when the data read from the memory cell is different from an expected value. The failure of the sub word decoder can be detected by executing the access operation two times without using a complicated test pattern. As stated above, one of the second or third switch is forcibly turned off, and thereby, it becomes possible to detect the operation failure of the sub word decoder easily and in a short time. An acceleration test can be executed by the forcibly turning off of the switch, and therefore, an occurrence rate of a reliability failure of a semiconductor memory can be reduced.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory, comprising:
    a plurality of memory cells each having a storage part of data and a transfer transistor;
    a plurality of sub word lines each coupled to a gate of the transfer transistor;
    a bit line coupled to the storage part via the transfer transistor;
    a plurality of sub word decoders provided with corresponding to the sub word lines, and having a first switch turning on when a main word line is in an activation level to couple any of the sub word lines to a high level voltage line, a second switch turning on when the main word line is in an inactivation level to couple the sub word line to a low level voltage line, and a third switch turning on when a word reset signal line is in an activation level to couple the sub word line to the low level voltage line; and
    a reset control circuit disabling one of the inactivation of the main word line and the activation of the word reset signal line to disable that one of the second switch and the third switch turns on during a test mode.

2. The semiconductor memory according to claim 1, further comprising:

sub word control circuits provided with corresponding to the sub word lines, and having a reset part resetting a corresponding word reset signal line to an inactivation level synchronously with an activation of a timing signal when an address signal indicates the sub word line;

a set part setting the corresponding word reset signal line to an activation level synchronously with an inactivation of the timing signal; and a set disable part disabling the setting by the set part during the test mode.

3. The semiconductor memory according to claim 1, further comprising:

a precharge circuit coupling the bit line to a precharge voltage line during activation of a precharge control signal showing a non-access state of the memory cells; and a timing control circuit generating the precharge control signal, and delaying the activation timing of the precharge control signal during the test mode compared to a normal operation mode to elongate a time from the inactivation of the main word line to a start of a precharge of the bit line.

4. The semiconductor memory according to claim 1, further comprising:

a main word decoder having a set part setting the main word line to the activation level synchronously with an activation of a first timing signal when the address signal indicates the main word line, and a reset part resetting the main word line to the inactivation level synchronously with an activation of a second timing signal; and a timing control circuit generating the second timing signal, and advancing the activation timing of the second timing signal during the test mode compared to the normal operation mode to elongate a time from the inactivation of the main word line to a start of a precharge of the bit line.

5. The semiconductor memory according to claim 1, further comprising:

a main word decoder having a set part setting the main word line to the activation level synchronously with an activation of a first timing signal when an address signal indicates the main word line, and a reset part resetting the main word line to the inactivation level synchronously with an activation of a second timing signal; and a timing control circuit generating the first timing signal, and delaying the activation timing of the first timing signal during the test mode compared to the normal operation mode to elongate a time from a stop of a precharge of the bit line to the activation of the main word line.

6. The semiconductor memory according to claim 5, further comprising:

a sense amplifier coupled to the bit line, and amplifying a signal amount of data read from the memory cell to the bit line during activation of a sense amplifier control signal; and a timing control circuit generating the sense amplifier control signal, and delaying the activation timing of the sense amplifier control signal during the test mode compared to the normal operation mode.

7. The semiconductor memory according to claim 1, further comprising:

a main word decoder having a set part setting the main word line to the activation level synchronously with an activation of a first timing signal when an address signal indicates the main word line, and a reset part resetting the main word line to the inactivation level synchronously with an activation of a second timing signal; and a reset control circuit inactivating the second timing signal for a predetermined period in response to an access request during the normal operation mode, and fixing the second timing signal to an inactivation level during the test mode.

8. The semiconductor memory according to claim 1, further comprising:

a refresh request generation circuit periodically generating a refresh request to execute a refresh operation of the memory cell; and a refresh disable circuit disabling the refresh operation during the test mode.

9. A test method of a semiconductor memory including:

a plurality of memory cells each having a storage part of data and a transfer transistor;

a plurality of sub word lines each coupled to a gate of the transfer transistor;

a plurality of main word lines commonly wired for a predetermined number of sub word lines;

a bit line coupled to the storage part via the transfer transistor;

a plurality of sub word decoders provided with corresponding to the sub word lines, and having a first switch turning on when one of the main word lines is in an activation level to couple the sub word line to a high level voltage line, a second switch turning on when one of the main word lines is in an inactivation level to couple the sub word line to a low level voltage line, and a third switch turning on when a word reset signal line is in an activation level to couple the sub word line to the low level voltage line; and a reset control circuit disabling the activation of the word reset signal line to disable that the third switch turns on during a test mode, comprising:

entering the semiconductor memory in the test mode;

executing an access operation by activating either of the main word lines;

exiting the semiconductor memory from the test mode;

executing a read operation by activating one of the main word lines; and detecting a failure of a corresponding sub word decoder when data read from the memory cell is different from an expected value.

10. The test method of the semiconductor memory according to claim 9, further comprising:

executing the access operation while sequentially changing the main word line to be activated after entering the semiconductor memory in the test mode; and executing the read operation while sequentially changing the main word line to be activated after exiting the semiconductor memory from the test mode.

11. A system comprising a semiconductor memory and a controller making access to the semiconductor memory, wherein the semiconductor memory includes:

a plurality of memory cells each having a storage part of data and a transfer transistor;

a plurality of sub word lines each coupled to a gate of the transfer transistor;

a bit line coupled to the storage part via the transfer transistor;

a plurality of sub word decoders provided with corresponding to the sub word lines, and having a first switch turning on when a main word line is in an activation level to couple any of the sub word lines to a high level voltage line, a second switch turning on when the main word line is in an inactivation level to couple the sub word line to a low level voltage line, and a third switch turning on when a word reset signal line is in an activation level to couple the sub word line to the low level voltage line; and a reset control circuit disabling one of the inactivation of the main word line and the activation of the word reset signal line to disable that one of the second switch and the third switch turns on during a test mode.

12. The system according to claim 11, wherein the semiconductor memory further includes:

sub word control circuits provided with corresponding to the sub word lines, and having a reset part resetting a corresponding word reset signal line to an inactivation level synchronously with an activation of a timing signal when an address signal indicates the sub word line;

a set part setting the corresponding word reset signal line to an activation level synchronously with an inactivation of the timing signal; and a set disable part disabling the setting by the set part during the test mode.

13. The system according to claim 11, wherein the semiconductor memory further comprises:

a main word decoder having a set part setting the main word line to the activation level synchronously with an activation of a first timing signal when an address signal indicates the main word line, and a reset part resetting the main word line to the inactivation level synchronously with an activation of a second timing signal; and a reset control circuit inactivating the second timing signal for a predetermined period in response to an access request during the normal operation mode, and fixing the second timing signal to an inactivation level during the test mode.

* * * * *